US012763289B2

(12) United States Patent
Kim et al.

(10) Patent No.: US 12,763,289 B2
(45) Date of Patent: Oct. 13, 2026

(54) SUBSTRATE PROCESSING METHOD AND SUBSTRATE PROCESSING APPARATUS USING THE SAME

(71) Applicant: ASM IP Holding B.V., Almere (NL)

(72) Inventors: Doohan Kim, Hwaseong-si (KR); YongGyu Han, Leuven (BE); KiChul Um, Osan-si (KR); DaeYoun Kim, Seo-gu (KR)

(73) Assignee: ASM IP Holding B.V., Almere (NL)

( * ) Notice: Subject to any disclaimer, the term of this patent is extended or adjusted under 35 U.S.C. 154(b) by 686 days.

(21) Appl. No.: 18/107,588

(22) Filed: Feb. 9, 2023

(65) Prior Publication Data

US 2023/0260754 A1 Aug. 17, 2023

Related U.S. Application Data

(60) Provisional application No. 63/309,836, filed on Feb. 14, 2022.

(51) Int. Cl.
*H01J 37/32* (2006.01)
*H01G 5/16* (2006.01)

(52) U.S. Cl.
CPC ......... *H01J 37/32183* (2013.01); *H01G 5/16* (2013.01); *H01J 37/32091* (2013.01); *H01J 2237/024* (2013.01); *H01J 2237/24564* (2013.01); *H01J 2237/24585* (2013.01); *H01J 2237/332* (2013.01)

(58) Field of Classification Search
CPC ........... H01J 37/32183; H01J 37/32091; H01J 2237/024; H01J 2237/24564; H01J 2237/24585; H01J 2237/332; H01J 37/32174; H01J 37/32449; H01J 2237/3321; H01G 5/16; C23C 16/45523; C23C 16/517; C23C 16/52; C23C 16/45536; H01L 21/0228; H01L 21/02274
See application file for complete search history.

(56) References Cited

U.S. PATENT DOCUMENTS

| | | | | | |
|---|---|---|---|---|---|
| 6,202,590 | B1 * | 3/2001 | Kim | H01J 37/32458 | 118/728 |
| 6,472,822 | B1 | 10/2002 | Chen et al. | | |
| 9,515,633 | B1 | 12/2016 | Long et al. | | |
| 10,643,822 | B2 | 5/2020 | Cheng | | |
| 2002/0160621 | A1 * | 10/2002 | Joma | G05B 19/41865 | 438/758 |
| 2015/0004803 | A1 * | 1/2015 | Yamasaki | C23C 16/34 | 438/776 |
| 2023/0129976 | A1 * | 4/2023 | Kobayashi | H01J 37/32091 | 438/792 |
| 2023/0352281 | A1 * | 11/2023 | Di Liberto | H01J 37/32926 | |

* cited by examiner

*Primary Examiner* — Patrick S Ott
(74) *Attorney, Agent, or Firm* — Snell & Wilmer L.L.P.

(57) ABSTRACT

A substrate processing method capable of performing a stable plasma process includes: supplying a source gas under a first plasma atmosphere using a substrate processing apparatus including a power generation unit, a first reactor, and a matching network between the power generation unit and the first reactor; purging the source gas; supplying a reaction gas under a second plasma atmosphere; and purging the reaction gas, wherein setting a variable capacitor included in the matching network to a first value is performed during the purging of the source gas, and setting the variable capacitor to a second value is performed during the purging of the reaction gas.

13 Claims, 28 Drawing Sheets

FIG. 24

| REACTOR | # OF STEPS | START POSITION | | STEP1 | | | STEP2 | | |
|---|---|---|---|---|---|---|---|---|---|
| | | VVC1(%) | VVC2(%) | INTER STEP TIME(ms) | VVC1(%) | VVC2(%) | INTER STEP TIME(ms) | VVC1(%) | VVC2(%) |
| RC1 | 2 | 28.7 | 57.5 | 120 | 54.5 | 44.6 | 120 | 28.7 | 57.5 |
| RC2 | 2 | 31.8 | 56.5 | 120 | 58.8 | 43.9 | 120 | 31.8 | 56.5 |
| RC3 | 2 | 32.5 | 56.9 | 120 | 58.2 | 44.3 | 120 | 32.5 | 56.9 |
| RC4 | 2 | 33.2 | 56.6 | 120 | 61.2 | 43.2 | 120 | 33.2 | 56.6 |

| | Auto-matching | Preset position matching |
|---|---|---|
| Reflected power(W) |  82.5W |  5.3W |
| Vpp |  65.8V |  184.4V |

SUBSTRATE PROCESSING METHOD AND SUBSTRATE PROCESSING APPARATUS USING THE SAME

CROSS-REFERENCE TO RELATED APPLICATIONS

This application claims priority to U.S. Provisional Patent Application Ser. No. 63/309,836 filed Feb. 14, 2022 titled SUBSTRATE PROCESSING METHOD AND SUBSTRATE PROCESSING APPARATUS USING THE SAME, the disclosure of which is hereby incorporated by reference in its entirety.

BACKGROUND

1. Field

One or more embodiments relate to a substrate processing method and a substrate processing apparatus using the same, and more particularly, to a plasma substrate processing method and a substrate processing apparatus for improving plasma supply efficiency in a substrate processing process using plasma.

2. Description of the Related Art

In recent years, as a line width of a semiconductor circuit shrinks, the requirements for thin film processing on a silicon substrate are becoming stricter, and in particular, research and development of low-temperature processes are becoming more active. To this end, a plasma process capable of processing a thin film at a low temperature has been developed. For example, in a thin film deposition process using plasma, plasma activates a reactive gas and promotes a reaction with a source gas so that a thin film may be formed at a low temperature.

For this plasma process, high-frequency power (e.g., radio frequency (RF) power) output from a power supply unit is supplied to a chamber (reactor). In order to prevent reflection of power generated during the supply process, impedance matching is performed between the power supply unit and the chamber. A matcher for impedance matching includes a variable capacitor and an inductor, and impedance matching may be implemented by adjusting a capacitance of the variable capacitor. Korean Patent No. 10-1570171 discloses an example of such a matcher.

SUMMARY

One or more embodiments include a substrate processing apparatus and a substrate processing method for performing fast radio frequency (RF) matching and stable plasma processing without generating reflected power in a plasma substrate processing process in which RF power of different magnitudes is periodically applied in the form of a pulse and an RF power supply cycle is short.

Additional aspects will be set forth in part in the description which follows and, in part, will be apparent from the description, or may be learned by practice of the presented embodiments of the disclosure.

According to one or more embodiments, a substrate processing method includes: supplying a source gas under a first plasma atmosphere using a substrate processing apparatus including a power generation unit, a first reactor, and a matching network between the power generation unit and the first reactor; purging the source gas; supplying a reaction gas under a second plasma atmosphere; and purging the reaction gas, wherein setting a variable capacitor included in the matching network to a first value is performed during the purging of the source gas, and setting the variable capacitor to a second value is performed during the purging of the reaction gas.

According to an example of the substrate processing method, the variable capacitor may include a moving unit and be configured to have a capacitance that is changed by movement of the moving unit, wherein a driving unit may set the variable capacitor to the first value by moving the moving unit to a first position in response to a first control signal from a control unit of the matching network, and may set the variable capacitor to the second value by moving the moving unit to a second position in response to a second control signal from the control unit.

According to another example of the substrate processing method, the control unit may be configured to receive first information from a scheduler and receive second information from the power generation unit.

According to another example of the substrate processing method, the power generation unit and the control unit are configured to receive a turn-off signal from a scheduler, wherein the turn-off signal may be different from the first information and the second information.

According to another example of the substrate processing method, the first information may include a value related to a moving time of the moving unit of the variable capacitor, and the second information may include a value related to a power level of the power generation unit.

According to another example of the substrate processing method, the first information may be a preset value stored in the scheduler.

According to another example of the substrate processing method, the control unit may be configured to calculate turn-off duration of the power generation unit from a value related to the power level.

According to another example of the substrate processing method, the control unit may be configured to calculate the turn-off duration by counting a time point at which the value related to the power level is maintained.

According to another example of the substrate processing method, during at least one of the setting of the variable capacitor to the first value and the setting of the variable capacitor to the second value, comparing a moving time of the moving unit to the turn-off duration of the power generation unit may be performed.

According to another example of the substrate processing method, during the comparing of the moving time of the moving unit with the turn-off duration of the power generation unit, it may be determined whether the turn-off duration is greater than the moving time.

According to another example of the substrate processing method, the control unit may be configured to perform a first adjustment operation on the variable capacitor included in the matching network during at least one of the purging of the source gas and the purging of the reaction gas.

According to another example of the substrate processing method, the control unit may be configured to perform a second adjustment operation on the variable capacitor included in the matching network during at least one of the supplying of the source gas and the supplying of the reaction gas.

A capacitance change range of the variable capacitor during the first adjustment operation may be greater than a capacitance change range of the variable capacitor during the second adjustment operation.

According to another example of the substrate processing method, the control unit may be configured to determine, during the first adjustment operation, whether a first condition in which the matching network receives a turn-off signal from the scheduler and a second condition in which turn-off duration of the power generation unit is greater than a time required for capacitance switching of the variable capacitor are satisfied.

According to another example of the substrate processing method, the control unit may perform the second adjustment operation of the variable capacitor after the first adjustment operation when both the first condition and the second condition are satisfied.

According to another example of the substrate processing method, at least one of the setting of the variable capacitor to the first value and the setting of the variable capacitor to the second value may be performed in response to at least one control signal generated by the control unit, wherein the control unit may be configured to prevent generation of the at least one control signal due to noise.

According to another example of the substrate processing method, the noise may include crosstalk power transmitted from a second reactor adjacent to the first reactor.

According to one or more embodiments, a substrate processing apparatus includes: a power generation unit configured to generate power in response to a turn-on signal received from a scheduler and to stop the generation of power in response to a turn-off signal received from the scheduler; a variable matching device electrically connected between the power generation unit and a reactor; and a control unit configured to change impedance of the variable matching device, wherein the control unit may be configured to perform a first adjustment operation of the impedance of the variable matching device in response to the turn-off signal received from the scheduler.

According to an example of the substrate processing apparatus, the control unit may be configured to perform a second adjustment operation of the impedance of the variable matching device in response to the turn-on signal received from the scheduler, wherein an impedance change range of the variable matching device during the first adjustment operation may be greater than an impedance change range of the variable matching device during the second adjustment operation.

According to one or more embodiments, a substrate processing apparatus includes: a power generation unit configured to generate power in response to a turn-on signal received from a scheduler and to stop the generation of power in response to a turn-off signal received from the scheduler; a variable matching device electrically connected between the power generation unit and a reactor; a power sensor configured to detect a power level of the power generation unit; and a control unit configured to change impedance of the variable matching device, wherein the control unit may be configured to perform a first adjustment operation of the impedance of the variable matching device in response to the turn-off signal received from the scheduler being maintained for a certain time, and to perform a second adjustment operation after the first adjustment operation in response to the power sensor detecting low-level power from the power generation unit.

According to an example of the substrate processing apparatus, the control unit may be configured to calculate turn-off duration of the power generation unit based on a period in which the power sensor detects the low-level power, and to determine whether the turn-off duration is equal to or greater than a certain value.

According to one or more embodiments, a substrate processing apparatus includes: a variable capacitor including a moving unit and configured to have a capacitance that is changed by movement of the moving unit; a driving unit configured to move the moving unit; and a control unit configured to generate a first control signal and a second control signal, wherein the driving unit may be configured to move the moving unit to a first position in response to the first control signal and to move the moving unit to a second position in response to the second control signal, and the control unit may be configured to alternately generate the first control signal and the second control signal.

According to one or more embodiments, a substrate processing apparatus includes: a variable capacitor including a moving unit and configured to have a capacitance that is changed by movement of the moving unit; a driving unit configured to move the moving unit; and a control unit configured to generate a first adjustment signal and a second adjustment signal, wherein the driving unit may be configured to move the moving unit by a first distance in response to the first adjustment signal and to move the moving unit by a second distance that is less than the first distance in response to the second adjustment signal.

According to an example of the substrate processing apparatus, the control unit may be configured to generate the first adjustment signal in response to a turn-off signal received from a scheduler and to generate the second adjustment signal in response to a turn-on signal received from the scheduler.

According to another example of the substrate processing apparatus, the first adjustment signal may include a first control signal and a second control signal, and the driving unit may be configured to move the moving unit to a first position in response to the first control signal and to move the moving unit to a second position in response to the second control signal.

According to another example of the substrate processing apparatus, the control unit may be configured to prevent generation of the first adjustment signal due to noise.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 24 is an RF table illustrating a preset position of each of two VVCs (VVC1 and VVC2) and an inter step time that enables fast impedance matching without generation of reflected power for each reactor in a chamber having four reactors;

DETAILED DESCRIPTION

Figure 1:
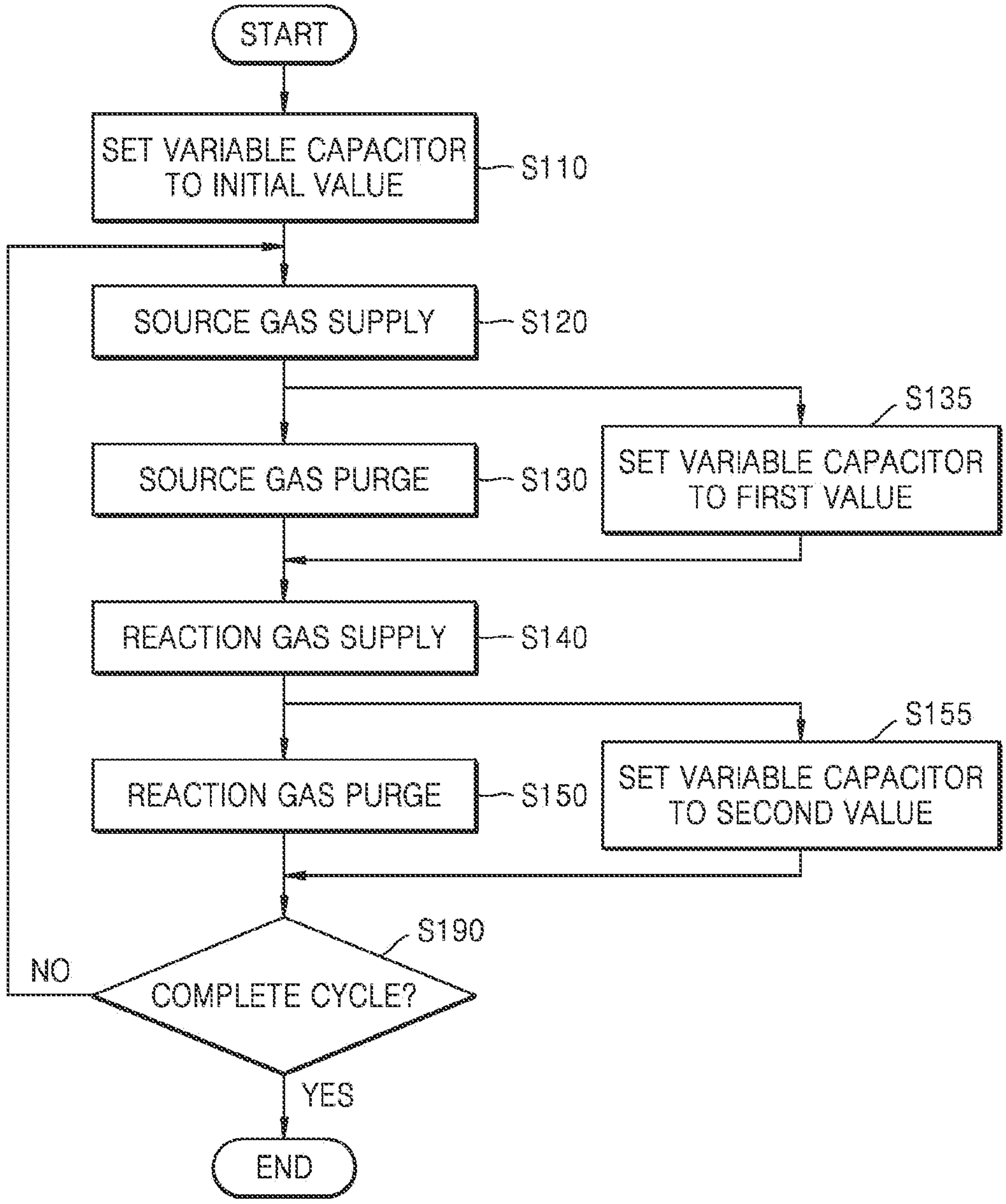
FIG. 1 is a flowchart schematically illustrating a substrate processing method of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the embodiments may have different forms and should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

Figure 2:
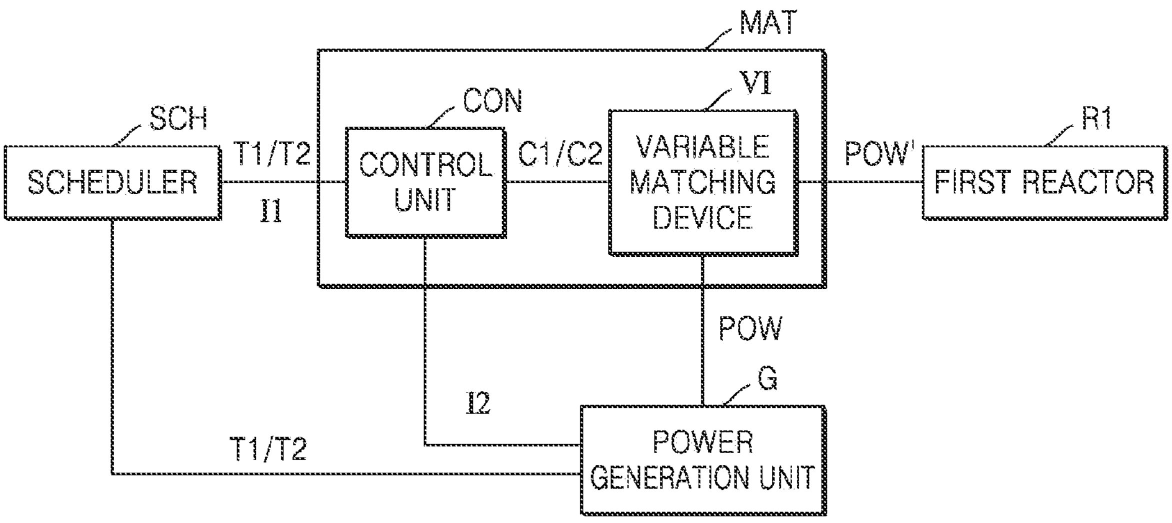
FIG. 2 is a schematic view of a substrate processing apparatus using the substrate processing method of FIG. 1.

FIG. 1 is a flowchart schematically illustrating a substrate processing method of the inventive concept. FIG. 2 is a schematic view of a substrate processing apparatus using the substrate processing method of FIG. 1.

Referring first to FIG. 2, the substrate processing apparatus may include a reactor for performing a processing process (e.g., a deposition process, an etching process, a cleaning process, etc.) on a substrate. The substrate may be a semiconductor substrate, a display substrate, or another target substrate to be processed. The substrate processing apparatus may include a plurality of reactors. In some embodiments, the substrate processing apparatus may be configured to simultaneously process a plurality of substrates through a plurality of reactors. A first reactor R1 shown in FIG. 2 may be one of the plurality of reactors.

The substrate processing apparatus may further include a power generation unit G and a matching network MAT in addition to the first reactor R1. In some embodiments, the substrate processing apparatus may include a scheduler SCH, and the scheduler SCH may be configured to control overall processes of the substrate processing apparatus. In another embodiment, the scheduler SCH may be a component external to the substrate processing apparatus.

The power generation unit G may be configured to generate power. For example, the power generation unit G may be configured to generate power in response to a turn-on signal T1 received from the scheduler SCH, and to stop generating the power in response to a turn-off signal T2 received from the scheduler SCH. In some embodiments, the power generation unit G may be configured to generate RF power.

The power generated by the power generation unit G may be applied to the first reactor R1 through the matching network MAT. In an embodiment, plasma may be generated in the first reactor R1 by the power. In some embodiments, the power generation unit G may have internal impedance of 50 ohms. A power generation operation of the power generation unit G and a processing operation in the first reactor R1 may be controlled by the scheduler SCH.

The matching network MAT may be connected between the power generation unit G and the first reactor R1. In more detail, a variable matching device VI may be electrically connected between the power generation unit G and the first reactor R1, and thus, the power generated by the power generation unit G may be transferred to the first reactor R1 through the variable matching device VI of the matching network MAT.

The matching network MAT may include the variable matching device VI and a control unit CON. The variable matching device VI may be configured to have variable impedance. In some embodiments, the variable matching device VI may include a variable capacitor. For example, a vacuum variable capacitor (VVC) that achieves a variable capacitance by mechanical movement, an electrical variable capacitor (EVC) that achieves a variable capacitance by electrical control, or a combination thereof may be utilized as the variable capacitor.

The control unit CON may be configured to change the impedance of the variable matching device VI. For example, the control unit CON may generate a control signal for changing the impedance of the variable matching device VI so that maximum power may be transferred from the power generation unit G to the first reactor R1. In some embodiments, the control unit CON may perform a first adjustment operation of the impedance of the variable matching device VI in response to the turn-off signal T2 received from the scheduler SCH.

In another embodiment, the control unit CON may generate a first control signal C1 and a second control signal C2 during the first adjustment operation. The variable matching device VI may set the impedance of the variable matching device VI (e.g. variable capacitance) to a first value in response to the first control signal C1. In addition, the variable matching device VI may set the impedance of the variable matching device VI (e.g. variable capacitance) to a second value in response to the second control signal C2.

As the impedance of the variable matching device VI is changed by the control signal of the control unit CON, the internal impedance of the power generation unit G and the equivalent impedance of a reactor viewed from the matching network MAT may be identically matched. As a result, power POW generated by the power generation unit G may be substantially the same as power POW' transferred to the first reactor R1 by the matching network MAT.

The substrate processing method using the substrate processing apparatus of FIG. 2 is shown in more detail in FIG. 1. Referring to FIG. 1, the substrate processing method may include source gas supply step S120 and reaction gas supply step S140, and purge steps S130 and S150 may be performed between the source gas supply step S120 and the reaction gas supply step S140. The source gas supply step S120, the source gas purge step S130, the reaction gas supply step S140, and the reaction gas purge step S150 may be repeatedly performed as one cycle. It may be noted that a source gas and a reaction gas might be generalized and interpreted as a first gas and a second gas for processing such as deposition/etching/cleaning/polishing.

Although the source gas purge step S130 and the reaction gas purge step S150 are shown as separate steps in FIG. 1, in some embodiments, purge gas may be continuously supplied throughout the cycle. The purge gas may be an inert gas, such as argon, or a relatively stable gas, such as nitrogen or oxygen.

Optionally, the purge gas may also be used as a reaction gas, in which case the purge gas and the reaction gas may be a single gas of the same type (i.e., a reactive purge gas). The reactive purge gas may be continuously supplied. Accordingly, when plasma is not applied, the reactive purge gas acts as a purge gas, and when plasma is supplied, the reactive purge gas is activated to perform a chemical reaction with source gas chemisorbed on a substrate.

For example, when the substrate processing apparatus performs a deposition process, the reactive purge gas may be an oxygen gas or nitrogen gas. Because the oxygen gas or nitrogen gas is not reactive with the source gas, the oxygen gas or nitrogen gas may serve as a purge gas before plasma is supplied. When plasma is supplied, the oxygen gas or nitrogen gas may be activated to react with the source gas, thereby forming an oxide layer or a nitride layer.

Referring back to FIG. 1, during step S110 of the substrate processing method, first, a variable capacitor may be set to an initial value. The initial value may be an impedance matching value for minimizing a plasma reflected power generated while supplying a source gas. The initial value may be the same as a second value in a step to be described later below.

Step S110 of setting the initial value of the variable capacitor may be performed before loading the substrate. In another embodiment, step S110 of setting the initial value of the variable capacitor may be performed during a purge step (not shown) performed after the loading of the substrate. The initial value of the variable capacitor is for impedance matching with respect to plasma applied during the subsequent source gas supply step S120, which will be described later below.

In step S120, after the variable capacitor is set to an initial value, a cycle is performed, during which a source gas is first supplied. For example, when the substrate processing apparatus performs a deposition process for forming a silicon-related film, the source gas may include at least one of silane materials such as monosilane, disilane, dichlorosilane, and an aminosilane such as bisdiethylaminosilane (BDEAS), diisopropylaminosilane (DIPAS), or iodosilane.

The source gas supply step S120 may be performed under a first plasma atmosphere. In other words, during the source gas supply step S120, plasma may be supplied to a reactor. The plasma may be implemented by an in-situ plasma method in which plasma is generated directly on a substrate in a reaction space, or a remote plasma method in which plasma is generated outside the reactor and supplied into the reaction space. For example, during the source gas supply step S120, a first plasma atmosphere may be formed by applying first power generated by the power generation unit G to the first reactor R1 through the matching network MAT.

In an example embodiment of the in-situ plasma method, plasma supply may be implemented in a reaction space between a gas supply device such as a showerhead and a substrate support plate. During plasma application, the showerhead may function as an upper electrode and the substrate support plate may function as a lower electrode. In this case, plasma may be generated due to a potential difference between the upper electrode and the lower electrode.

Plasma power applied during the source gas supply step S120 may be different from plasma power applied during reaction gas supply step S140 to be described later below. For example, the first power of the first plasma atmosphere during the source gas supply step S120 may be less than the second power of the second plasma atmosphere during the reaction gas supply step S140. Because plasma power under different conditions is applied to a reaction space while a cycle is repeated, impedance matching needs to be continuously changed.

According to embodiments of the inventive concept, during the source gas purge step S130 between the source gas supply step S120 and the reaction gas supply step S140, a variable capacitor included in the matching network MAT is set to the first value as shown in step S135. Accordingly, the first power of the first plasma atmosphere may be transferred to the first reactor R1 without loss. In addition, as will be described later, during the reaction gas purge step S150 between the reaction gas supply step S140 and the source gas supply step S120, the variable capacitor included in the matching network MAT is set to a second value as shown in step 155. Accordingly, the second power of the second plasma atmosphere may be transferred to the first reactor R1 without loss.

In order to set the variable capacitor included in the matching network MAT to the first value (step S135) during the source gas purge step S130, and to set the variable capacitor included in the matching network MAT to the second value (step S155) during the reaction gas purge step S150, the control unit CON of the matching network MAT may receive information for adjusting the variable capacitor (hereinafter referred to as 'tuning information') from the scheduler SCH. For example, when the variable capacitor is implemented as an EVC, the tuning information received by the control unit CON may include switching information.

In another example, when the variable capacitor is implemented as a VVC, the tuning information received by the control unit CON of the matching network MAT may be information regarding a position of a moving unit (moving electrode) in the VVC. In this regard, this is described later in more detail with reference to FIGS. 7 and 8.

Thereafter, it is determined whether the cycle is completed in step S190, and when the cycle is completed, the corresponding processing process is terminated. When the cycle is not completed, the cycle is repeated again and the source gas supply step S120 is performed. Because the variable capacitor is set to the second value during the reaction gas purge step S150, plasma matching may be achieved during the subsequent source gas supply step S120.

Figure 3:
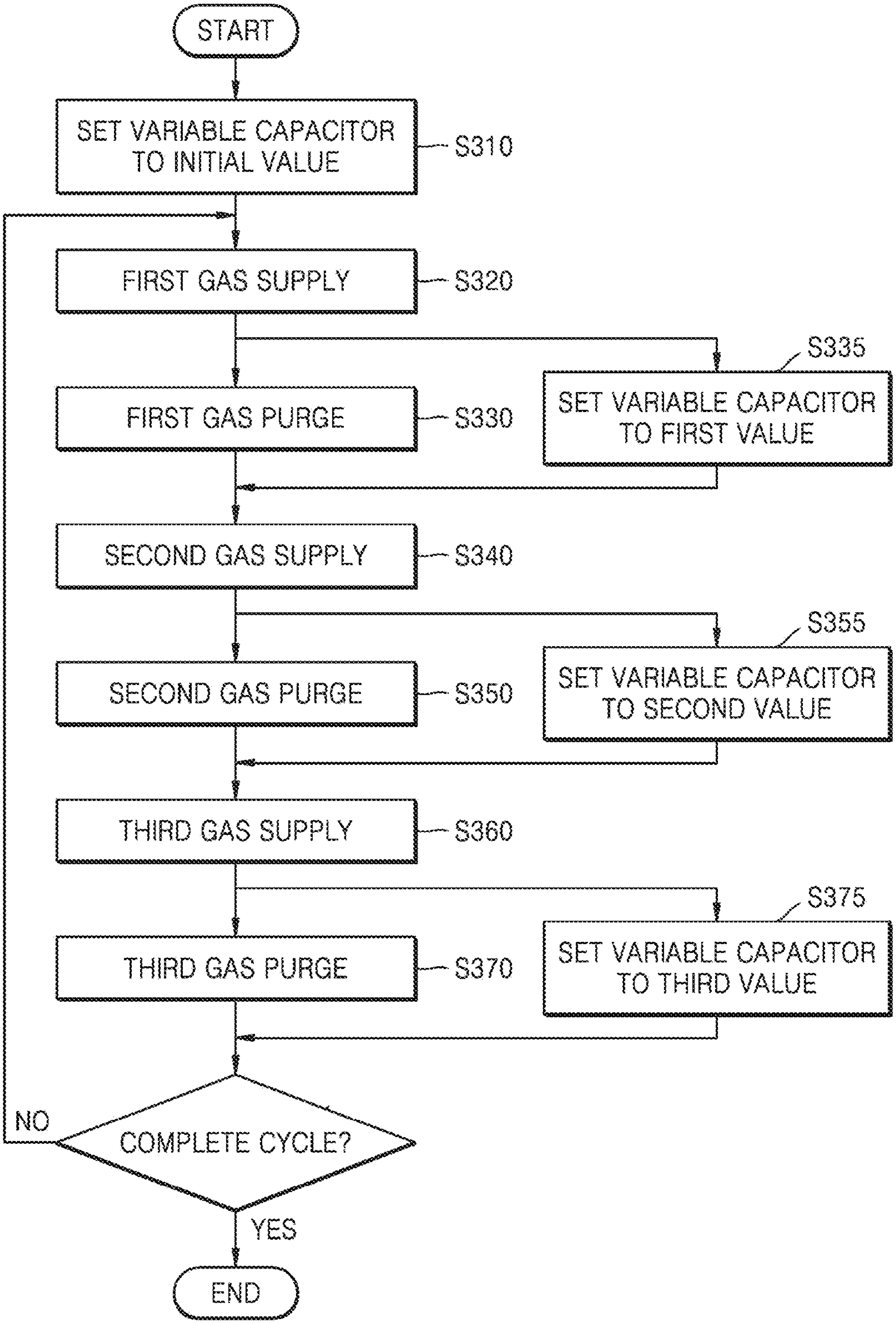
FIG. 3 is a flowchart schematically illustrating a substrate processing method according to embodiments of the inventive concept.

FIG. 3 is a flowchart schematically illustrating a substrate processing method according to embodiments of the inventive concept. The substrate processing method according to these embodiments may be variations of the substrate processing method according to the embodiments illustrated in FIG. 1. In addition, in some embodiments, the substrate processing method may be performed using a matching network of the substrate processing apparatus of FIG. 2. Hereinafter, repeated descriptions of the embodiments are omitted.

Referring to FIG. 3, a cycle of the substrate processing method may include a first gas supply step S320, a second gas supply step S340, and a third gas supply step S360, and may include purge steps S330, S350, and S370 between the first gas supply step S320 and the second gas supply step S340, between the second gas supply step S340 and the third gas supply step S360, and between the third gas supply step S360 and the first gas supply step S320.

In some embodiments, the first gas supply step S320 and the second gas supply step S340 of FIG. 3 may correspond to the source gas supply step S120 and the reaction gas supply step S140 of FIG. 1, respectively. In other words, after the source gas supply step S120 and the reaction gas supply step S140, an additional third gas supply step S360 and a third gas purge step S370 may be performed. In addition, during the third gas purge step S370, step S375 of setting a variable capacitor to a third value may be performed, and in this case, the third value may be the same as the initial value set in step S310.

In another embodiment, the first gas supply step S320 and the third gas supply step S360 of FIG. 3 may correspond to the source gas supply step S120 and the reaction gas supply step S140 of FIG. 1, respectively. In other words, an additional gas supply step and a purge step may be performed between the source gas supply step S120 and the reaction gas supply step S140.

It may be noted that although steps S335, S355, and S375 of adjusting the variable capacitor are shown to be performed in all of the gas supply steps in the embodiment of FIG. 3, the disclosure is not limited thereto. For example, at least one of steps S335, S355, and S375 of adjusting the variable capacitor may be omitted. For example, the second gas supply step S340 and the third gas supply step S360 may be performed under the same plasma atmosphere, and in this case, step S375 of setting the variable capacitor to the third value may not be performed.

As another example, the second gas supply step S340 and the third gas supply step S360 may be performed under different plasma atmospheres, and the first gas supply step S320 may be performed without separate plasma application. In this case, step S335 of setting the variable capacitor to the first value may not be performed.

Figure 4:
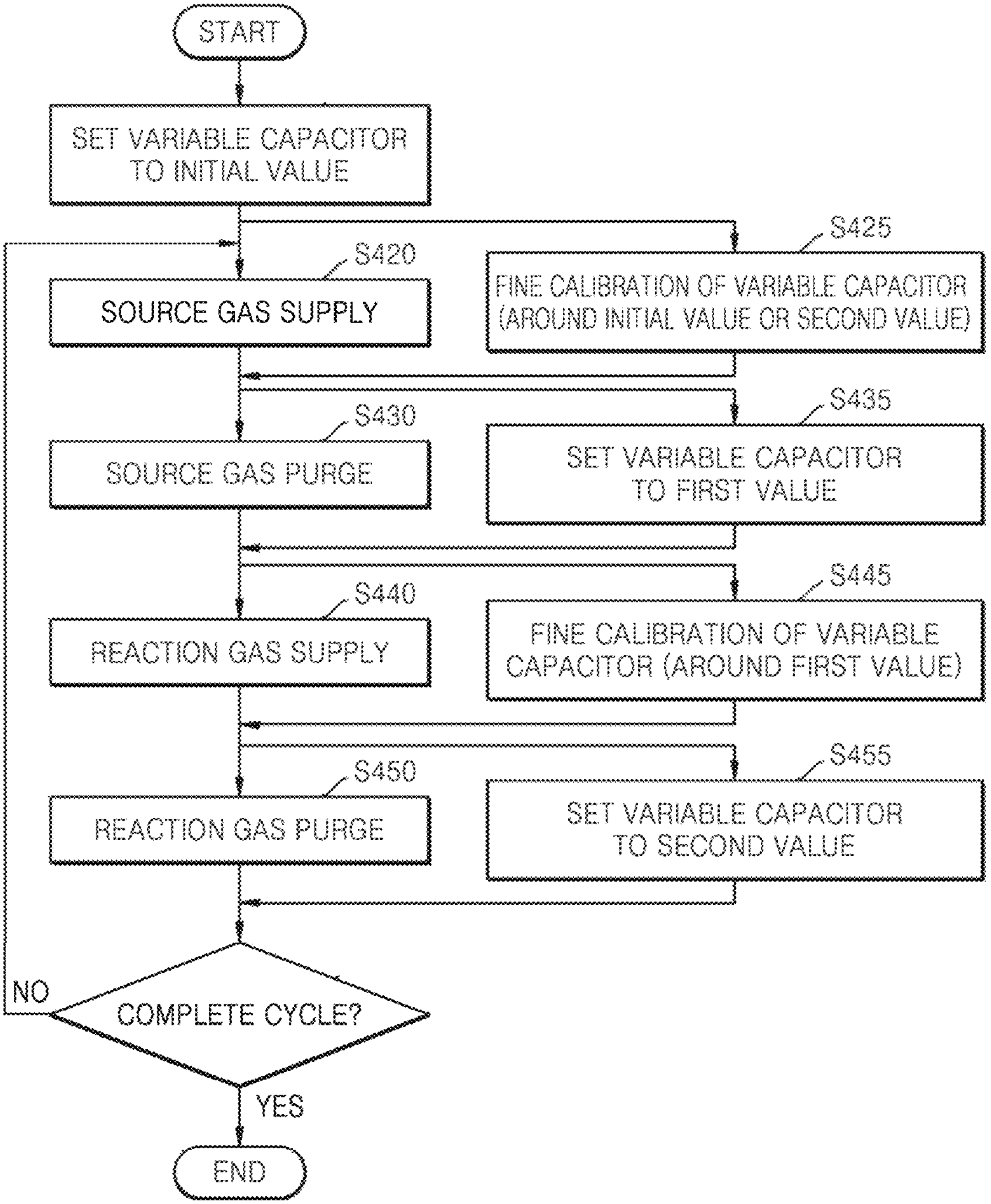
FIG. 4 is a flowchart schematically illustrating a substrate processing method according to embodiments of the inventive concept.

FIG. 4 is a flowchart schematically illustrating a substrate processing method according to embodiments of the inventive concept. The substrate processing method according to these embodiments may be variations of the substrate processing method according to the embodiments illustrated in FIG. 1. In addition, in some embodiments, the substrate processing method may be performed using a matching network of the substrate processing apparatus of FIG. 2. Hereinafter, repeated descriptions of the embodiments are omitted.

Referring to FIG. 4, as described above in the embodiment of FIG. 1, the source gas purge step S430 may include step S435 of setting the variable capacitor to the first value, and the reaction gas purging step S450 may include step S455 of setting the variable capacitor to the second value. Hereinafter, steps S435 and S455 of setting the variable capacitor to the first to second values may be referred to as a first adjustment operation of the impedance of the variable matching device VI.

In some embodiments, the first adjustment operation may be performed in response to the turn-off signal T2 received from the scheduler SCH. In other words, the first adjustment operation may be performed by the control unit CON of the matching network MAT receiving the turn-off signal T2 and controlling the variable matching device VI in response thereto. In some embodiments, the control unit CON may generate a first adjustment signal during the first adjustment operation and transmit the first adjustment signal to the variable matching device VI, and the variable matching device VI may change impedance in response to the first adjustment signal.

In a further embodiment, in the substrate processing method, a fine calibration step S425 of the variable capacitor may be performed during the source gas supply step S420. In addition, the substrate processing method may perform a fine calibration step S445 of the variable capacitor during the reaction gas supply step S440. Hereinafter, these fine calibration steps S425 and S445 may be referred to as a second adjustment operation of the impedance of the variable matching device VI.

The second adjustment operation may be adaptively made with respect to the impedance of a reactor that is changed by a minute environmental change in the first reactor R1. For example, during the source/reaction gas supply steps S420 and S440, process conditions such as a gas flow rate and pressure of a reaction space may be changed due to the supply of a source/reaction gas. By performing the second adjustment operation in response to the change in the process conditions, generation of reflected power during a processing process may be prevented.

In some embodiments, the second adjustment operation may be performed in response to the turn-on signal T1 received from the scheduler SCH. In other words, the second adjustment operation may be performed by the control unit CON of the matching network MAT receiving the turn-on signal T1 and controlling the variable matching device VI in response thereto. In some embodiments, the control unit CON may generate a second adjustment signal during the second adjustment operation and transmit the second adjustment signal to the variable matching device VI, and the variable matching device VI may change impedance in response to the second adjustment signal.

Because the second adjustment operation is to change the impedance in response to a change in process conditions in the reactor, the second adjustment operation may have a relatively small impedance change range. For example, during the second adjustment operation performed during the source gas supply step S420, the variable capacitor may be finely calibrated to an initial value or a value around the second value. In addition, during the second adjustment operation performed during the reaction gas supply step S440, the variable capacitor may be finely calibrated to a value around the first value.

An impedance change range of the variable matching device VI due to the fine calibration of the capacitance during the second adjustment operation described above may be less than the impedance change range of the variable matching device VI during the first adjustment operation. This is because the first adjustment operation is performed to respond to an impedance change due to the total switching from the first plasma atmosphere in the source gas supply step S420 to the second plasma atmosphere in the reaction gas supply step S440 (or vice versa), while the second adjustment operation is performed to respond to an impedance change caused by partially changing process conditions under the same plasma atmosphere.

As a result, a range in which the capacitance of the variable capacitor is changed during the first adjustment operation, that is, during step S435 of setting the variable capacitor to the first value and step S455 of setting the variable capacitor to the second value, may be greater than a range in which the capacitance of the variable capacitor is changed during the fine calibration step, that is, during the fine calibration steps S425 and S445 for the variable capacitor.

Figure 5:
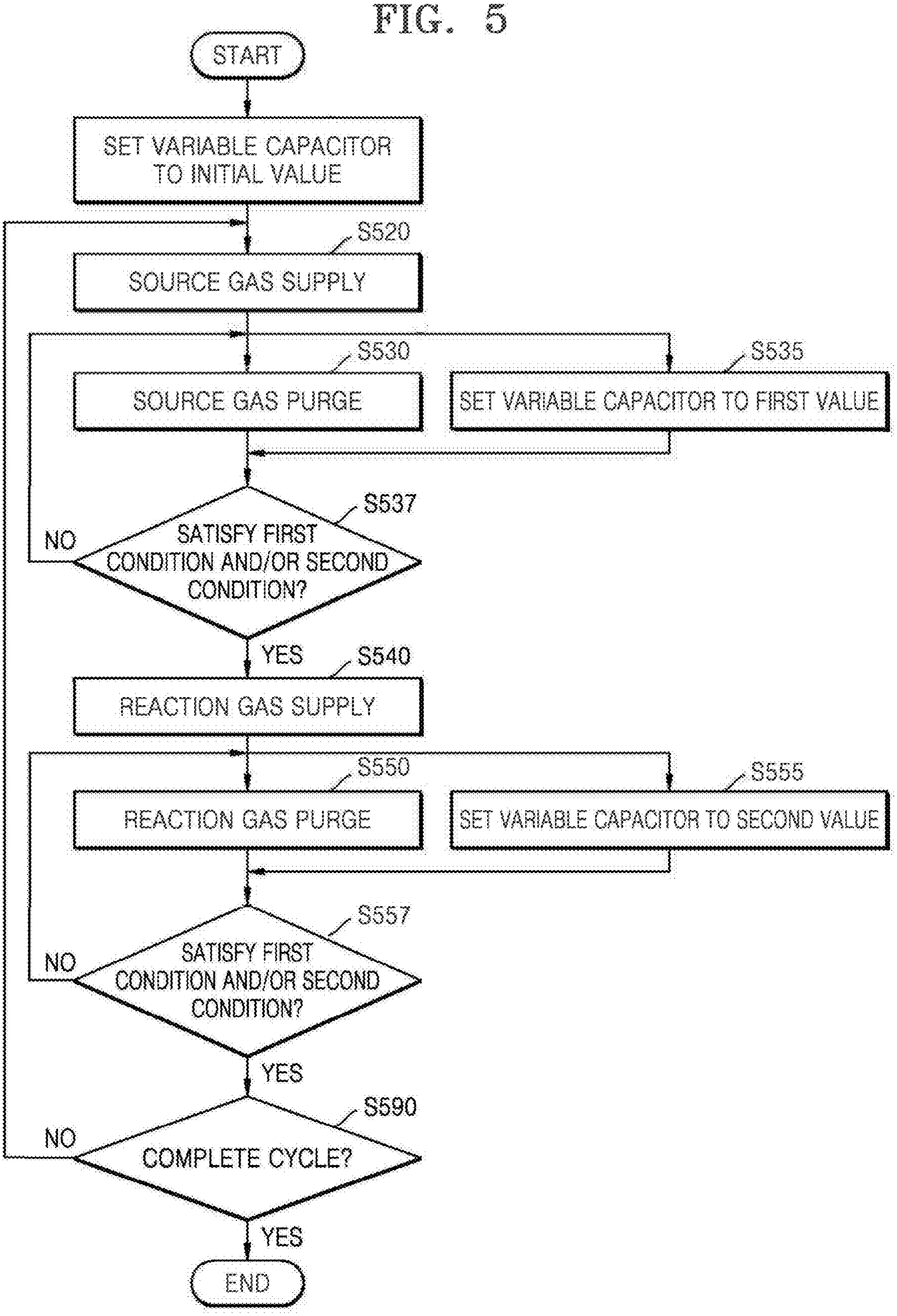
FIG. 5 is a flowchart schematically illustrating a substrate processing method according to embodiments of the inventive concept.
Figure 6:
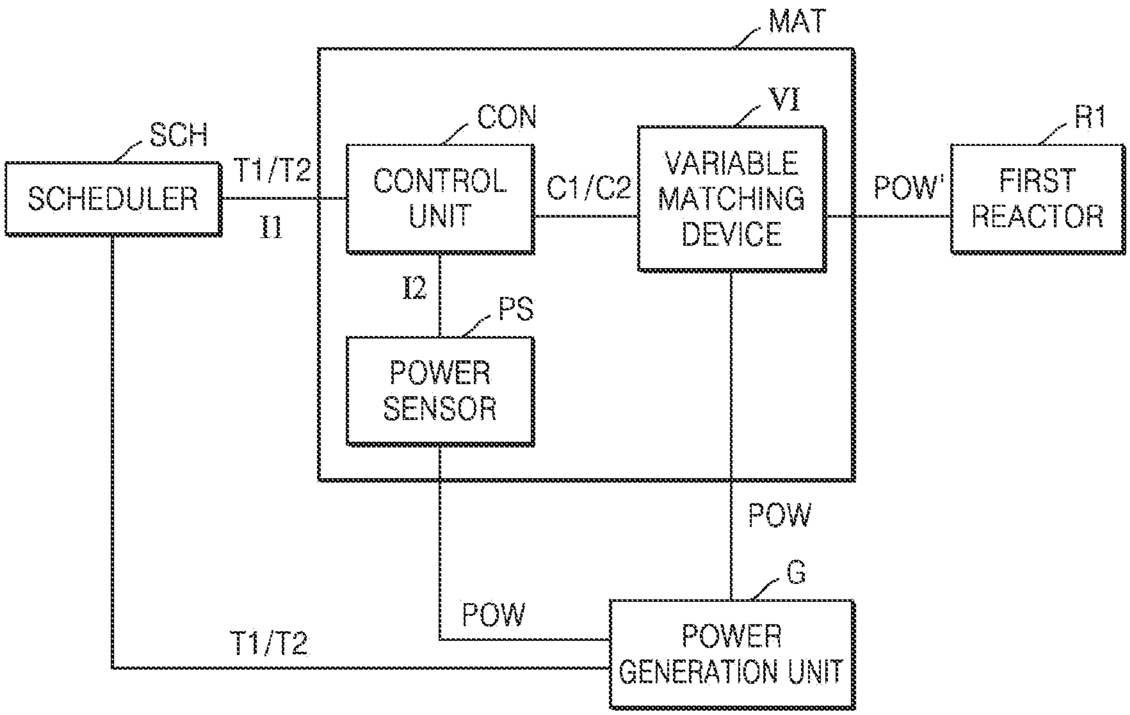
FIG. 6 is a schematic view of a substrate processing apparatus using the substrate processing method of FIG. 5.

FIG. 5 is a flowchart schematically illustrating a substrate processing method according to embodiments of the inventive concept. FIG. 6 is a schematic view of a substrate processing apparatus using the substrate processing method of FIG. 5. The substrate processing method and the substrate processing apparatus according to these embodiments may be variations of the substrate processing method and the substrate processing apparatus according to the previous embodiments. Hereinafter, repeated descriptions of the embodiments are omitted.

Referring to FIGS. 5 and 6, as described above, operations performed during a first adjustment operation, that is, step S535 of setting a variable capacitor to a first value and step S555 of setting a variable capacitor to a second value may be performed during a source gas purge step S530 and a reaction gas purge step S550, respectively. In addition, step S535 of setting the variable capacitor to the first value may be performed in response to the first control signal C1 generated by the control unit CON, and step S555 of setting the variable capacitor to the second value may be performed in response to the second control signal C2 generated by the control unit CON.

In some embodiments, after the source gas purge step S530 and before reaction gas supply step S540 is performed, step S537 of determining whether at least one of a first condition and a second condition is satisfied may be performed. In addition, between the reaction gas purge step S550 and step S590 of determining whether a cycle is completed, step S557 of determining whether at least one of the first condition and the second condition is satisfied may be performed.

As a specific example, during the first adjustment operation, the control unit CON may be configured to determine whether the first condition that the matching network MAT receives the turn-off signal T2 from the scheduler SCH and/or the second condition that turn-off duration of the power generation unit G is greater than the time required for capacitance switching of a variable capacitor in the variable matching device VI (i.e., switching from the first value to the second value or switching from the second value to the first value) is satisfied.

By performing steps S537 and S557 of determining whether the first condition and/or the second condition is satisfied, an erroneous control signal may be prevented from being generated by the control unit CON due to noise. For example, a noise signal may be generated, for example, by other conductive components (e.g., a second reactor) of the substrate processing apparatus, and the noise signal may be applied to the control unit CON of another conductive components (e.g., a first reactor) as a pseudo turn-on signal.

When a true turn-on signal T1 generated from the scheduler SCH is applied to the control unit CON, this means that source gas supply step S520 or reaction gas supply step S540 is performed, so the control unit CON needs to stop an operation of changing the capacitance of the variable capacitor in the variable matching device VI. However, as described above, when the noise signal generated by the adjacent component is applied to the control unit CON as a pseudo-turn-on signal, the control unit CON may generate a problematic control signal for stopping a capacitance switching operation of the variable capacitor, and the capacitance switching operation may be stopped due to the problematic control signal, thereby causing a process failure. For example, when the pseudo turn-on signal is applied to the source gas purge step or the reaction gas purge step, the capacitance switching step of the variable capacitor, which needs to be performed in the source gas purge step or the reaction gas purge step, may be interrupted, thereby causing a process error.

According to some embodiments of the inventive concept, by allowing the subsequent process (i.e., source gas supply step S520 or reaction gas supply step S540) to be performed when both the first and second conditions are satisfied, a problem in which a process error due to such noise occurs may be prevented.

Referring back to FIG. 6, in some embodiments, to determine whether the first condition and the second condition are satisfied, the control unit CON in the matching network MAT of the substrate processing apparatus may be configured to receive first information I1 from the scheduler SCH and second information I2 from the power generation unit G. It may be noted that the second information I2 is different from the turn-off signal T2 received by the power generation unit G and the control unit CON from the scheduler SCH.

In some embodiments, the first information I1 received by the control unit CON of the matching network MAT from the scheduler SCH may include at least one of a value related to the time required to perform the setting of the variable capacitor to the first value and a value related to the time required to perform the setting of the variable capacitor to the second value.

In some embodiments, when the variable matching device VI is implemented as the VVC (see FIG. 8), the first information I1 may include a value related to a moving time of a moving unit. For example, the first information I1 may include a value related to the time required to move the moving unit to a first position and a value related to the time required to move the moving unit to a second position. In another embodiment, the first information I1 may include a single value corresponding to a distance between the first position and the second position.

In another embodiment, when the variable matching device VI is implemented in an EVC or VVC-EVC hybrid structure, the first information I1 may include a value related to a switching time of a switch in the matching network MAT. For example, the first information I1 may include a value related to the time required to turn off a first switch and turn on a second switch and a value related to the time required to turn on the first switch and turn off the second switch. In another embodiment, the first information I1 may include a single value corresponding to the time required to switch between the first switch and the second switch.

In a further embodiment, the first information I1 may include other values necessary for the operation of the matching network MAT. For example, as shown in FIG. 24, the first information I1 may further include the number of repetitions of a cycle, information about an initial position of a moving unit, information about the first position of the moving unit, and information about the second position of the moving unit. In addition, the first information I1 may be a preset value stored in the scheduler SCH, and the preset value may be stored for each reactor.

In some embodiments, the second information I2 that the control unit CON of the matching network MAT receives from the power generation unit G may include a value related to a power level of the power generation unit G. For example, as shown in FIG. 6, the matching network MAT may further include a power sensor PS electrically connected to the power generation unit G, and the power sensor PS may sense power POW generated by the power generation unit G and transmit the second information I2 including a value related to a level of the power to the control unit CON. In another embodiment, the power sensor PS may be implemented in the control unit CON. In another alternative embodiment, as shown in FIG. 2, the power sensor PS may be implemented in the power generation unit G so that the second information I2 may be transmitted from the power generation unit G to the control unit CON.

Figure 7:
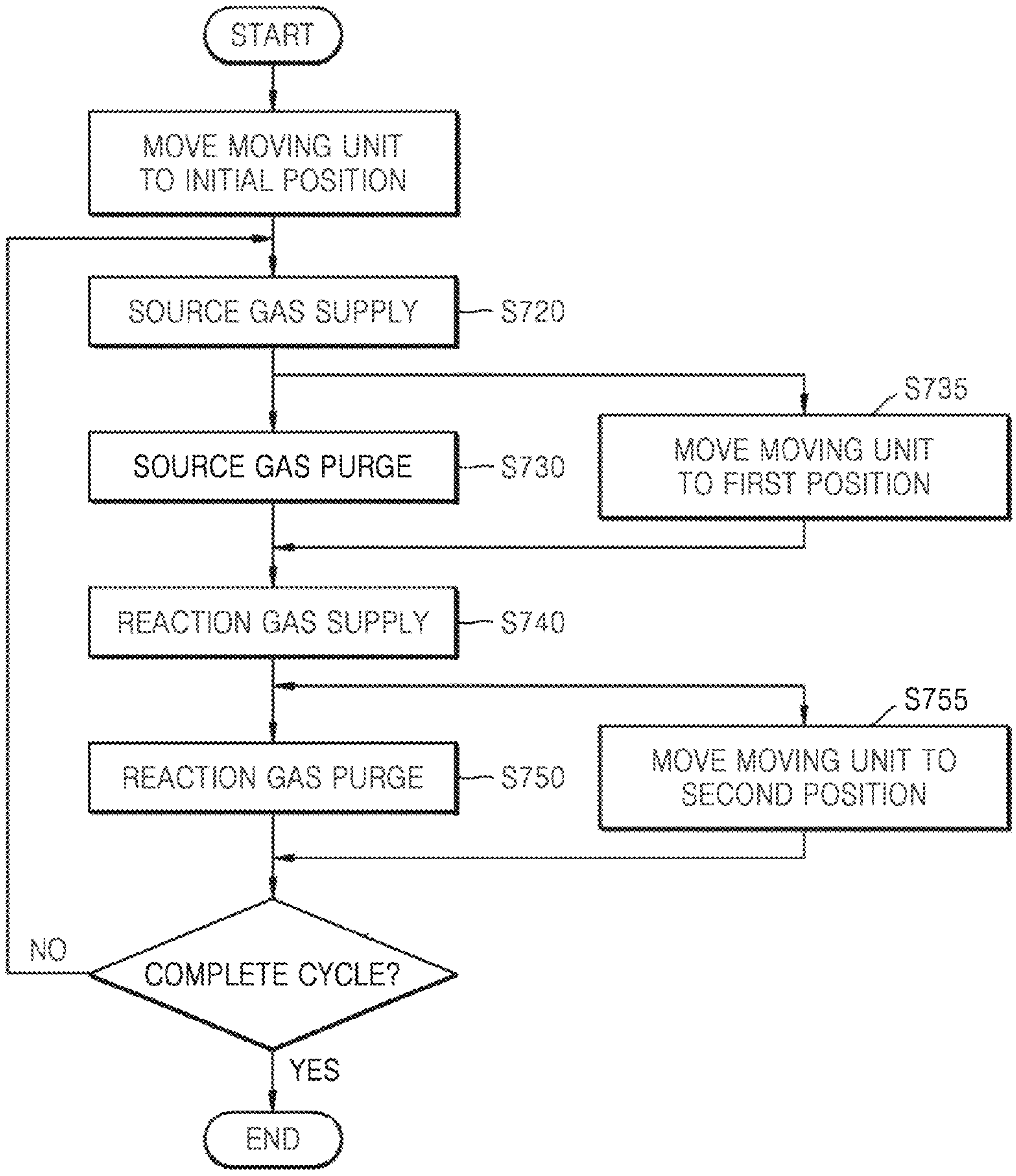
FIG. 7 is a flowchart schematically illustrating a substrate processing method according to embodiments of the inventive concept.
Figure 8:
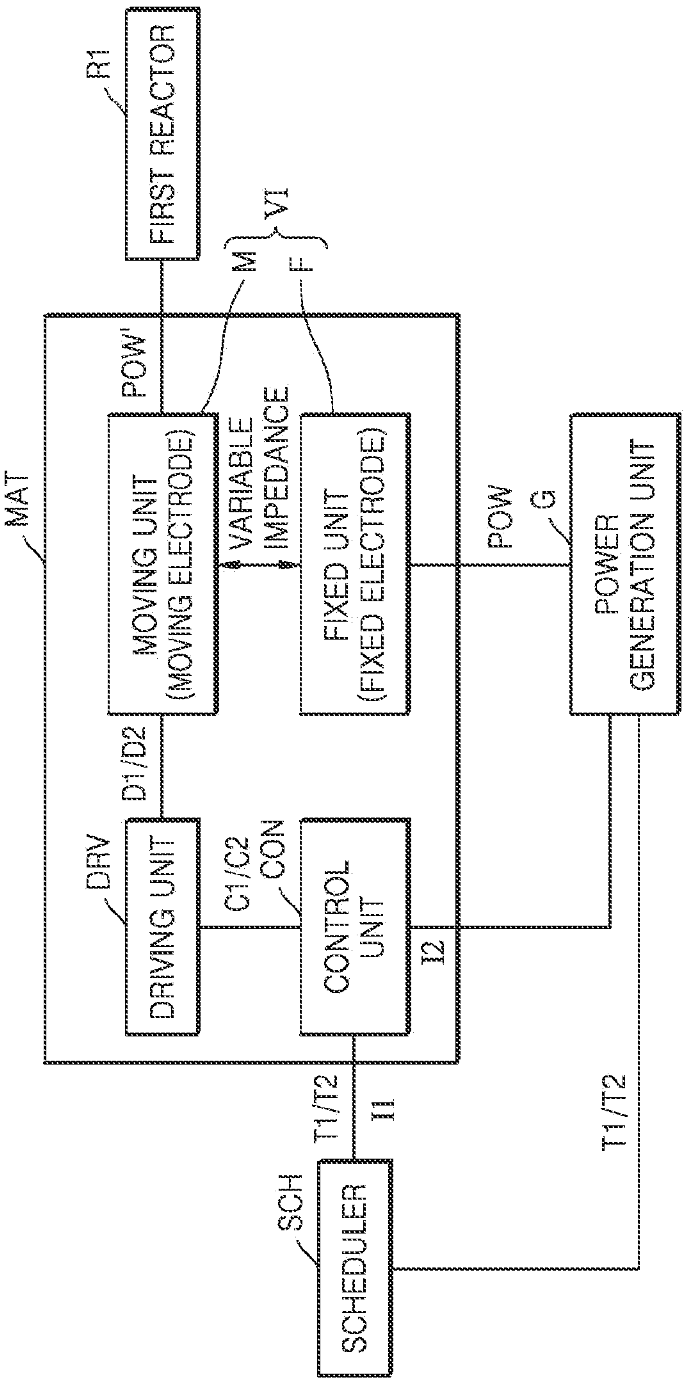
FIG. 8 is a schematic view of a substrate processing apparatus using the substrate processing method of FIG. 7.

FIG. 7 is a flowchart schematically illustrating a substrate processing method according to embodiments of the inventive concept. FIG. 8 is a schematic view of a substrate processing apparatus using the substrate processing method of FIG. 7. The substrate processing method and the substrate processing apparatus according to these embodiments may be variations of the substrate processing method and the substrate processing apparatus according to the previous embodiments. Hereinafter, repeated descriptions of the embodiments are omitted.

In some embodiments, as shown in FIG. 8, the substrate processing apparatus may perform the substrate processing method using the variable matching device VI capable of obtaining variable impedance through mechanical movement. For example, the variable matching device VI of the matching network MAT may include a fixing unit F and a moving unit M movable with respect to the fixing unit F. In addition, the matching network MAT may include a driving unit DRV configured to move the moving unit M. The variable impedance may be achieved by changing the impedance of the variable matching device VI due to the movement of the moving unit M by the driving unit DRV.

For example, the variable matching device VI may be implemented as a VVC (Vacuum Variable Capacitance), and in this case, the variable matching device VI may include the fixing unit F including a fixed electrode and the moving unit M including a moving electrode. As a capacitance between the moving electrode and the fixed electrode is changed by movement of the moving electrode, the impedance of the variable matching device VI may be changed. Hereinafter, description will be made on the premise that the variable matching device VI includes a variable capacitor using a VVC.

Referring to FIG. 7, in order to set the variable capacitor to the first value during source gas purge step S730, step S735 of moving the moving unit M of the variable capacitor to the first position may be performed. The first position may be a position of the moving electrode at which reflected power compared to power applied during the reaction gas supply step S740 after the source gas purge step S730 is minimized or reflected power is not substantially generated.

In addition, during reaction gas purge step S750, step S755 of moving the moving unit M of the variable capacitor to a second position may be performed. The second position may be a position of the moving electrode at which reflected power compared to the power applied during source gas supply step S720 after the reaction gas purge step S750 is minimized or reflected power is not substantially generated. In some embodiments, the power applied during the source gas supply step S720 may be less than the power applied during the reaction gas supply step S740 (see FIG. 18).

Operation S735 of moving the moving unit M of the variable capacitor to the first position may be controlled by the control unit CON. For example, as shown in FIG. 8, the control unit CON may transmit the first control signal C1 to the driving unit DRV, and the driving unit DRV may generate a first driving signal D1 for moving the moving unit M to the first position in response to the first control signal C1 from the control unit CON. Accordingly, the variable capacitor may be set to the first value corresponding to the first position, and in a subsequent step, a reaction gas may be supplied with the generation of reflected power suppressed.

Similarly, moving of the moving unit M of the variable capacitor to the second position may also be controlled by the control unit CON. For example, the control unit CON may transmit the second control signal C2 to the driving unit DRV, and the driving unit DRV may generate a second driving signal D2 for moving the moving unit M to the second position in response to the second control signal C2 from the control unit CON. Accordingly, the variable capacitor may be set to the second value corresponding to the second position, and in a subsequent step, a source gas may be supplied with the generation of reflected power suppressed.

Due to the repetition of a cycle, step S735 of moving the moving unit M to the first position and step S755 of moving the moving unit M to the second position may be alternately performed. Accordingly, the control unit CON may alternately generate the first control signal C1 and the second control signal C2.

Figure 9:
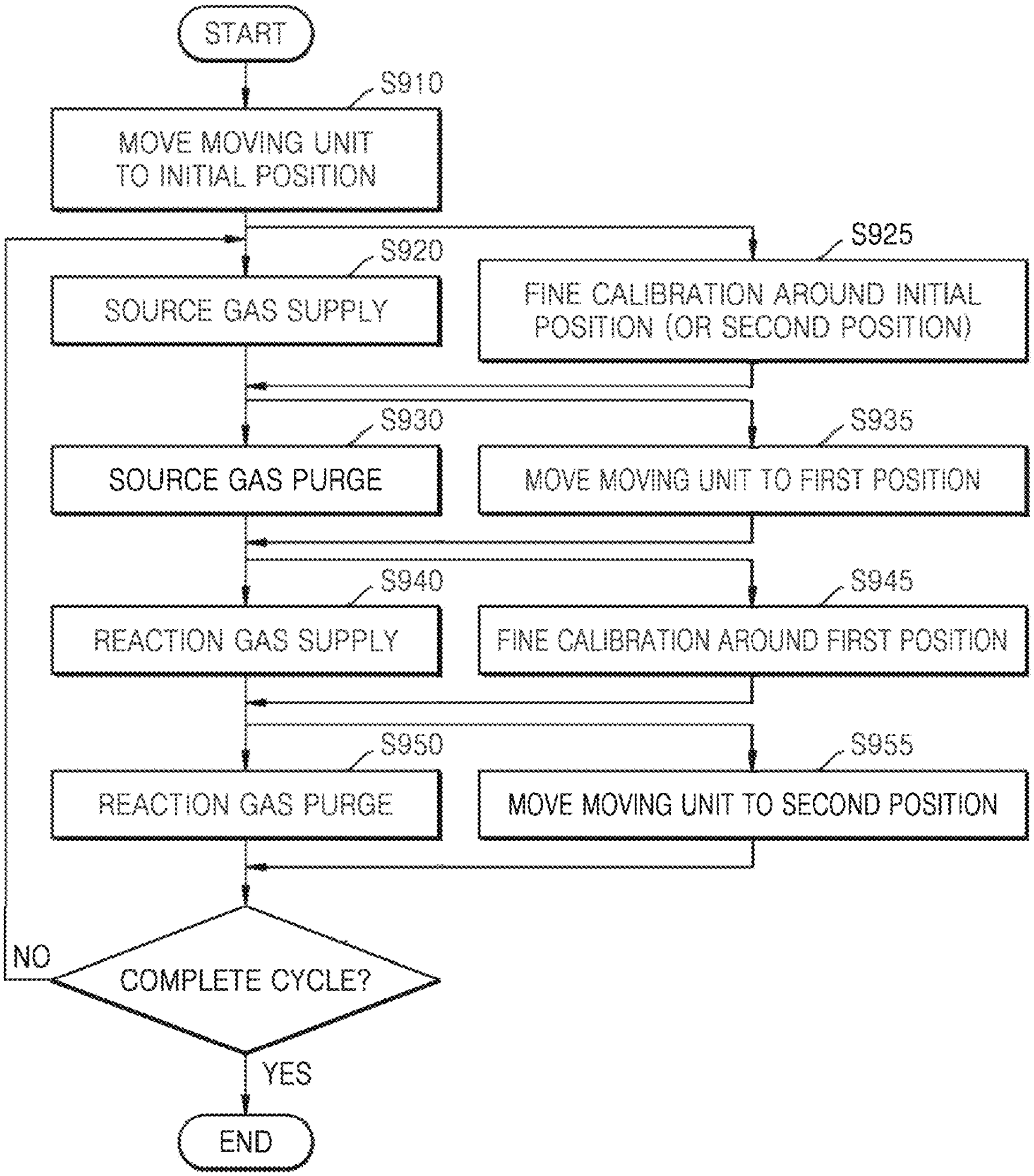
FIG. 9 is a flowchart schematically illustrating a substrate processing method according to embodiments of the inventive concept.

Although, in the embodiments of FIGS. 7 and 8, the control unit CON is shown and described to perform the first adjustment operation of the impedance of the variable matching device VI performed during a purge step in response to the turn-off signal T2 received from the scheduler SCH, in a further embodiment, in response to the turn-on signal T1 received from the scheduler SCH, the control unit CON may also perform a second adjustment operation of the impedance of the variable matching device VI during a gas supply step. FIG. 9 illustrates a substrate processing method when the control unit CON performs both a first adjustment operation and a second adjustment operation.

FIG. 9 is a flowchart schematically illustrating a substrate processing method according to embodiments of the inventive concept. The substrate processing method according to these embodiments may be variations of the substrate processing method according to the embodiments illustrated in FIG. 7. Hereinafter, repeated descriptions of the embodiments are omitted.

Referring to FIG. 9, in step S910, after moving the moving unit M to an initial position, source gas supply step S920 is performed. In order to form a first plasma atmosphere during the source gas supply step S920, first power may be generated by the power generation unit G, and the first power may be supplied to the first reactor R1 through the matching network MAT. To this end, the scheduler SCH may transmit the turn-on signal T1 to the power generation unit G and the control unit CON of the matching network MAT.

The control unit CON may perform a second adjustment operation in response to the turn-on signal T1. In other words, a fine calibration step S925 of capacitance of a variable capacitor may be performed around the second position in response to a change in impedance of the first reactor R1 while a source gas is supplied under the first plasma atmosphere. Because a change in capacitance during the second adjustment operation is relatively small, the moving unit M may move by a relatively small moving distance (i.e., a second distance) around the initial position.

After the source gas supply step S920, source gas purge step S930 is performed. During the source gas purge step S930, step S935 of moving the moving unit M to a first position may be performed. In addition, plasma power supply may be stopped during the source gas purge step S930. Accordingly, the scheduler SCH may transmit the turn-off signal T2 to the power generation unit G and the control unit CON of the matching network MAT.

The control unit CON may perform the first adjustment operation in response to the turn-off signal T2. That is, in order to prevent reflected power that may be generated during the subsequent reaction gas supply step S940, step S935 of setting the capacitance of the variable capacitor to a first value may be performed. Because a change in capacitance during the first adjustment operation is relatively large, the moving unit M may move by a relatively large moving distance (i.e., a first distance) from the initial position.

After the source gas purge step S930, the reaction gas supply step S940 is performed. In order to form a second plasma atmosphere during the reaction gas supply step S940, second power may be generated by the power generation unit G, and the second power may be supplied to the first reactor R1 through the matching network MAT. To this end, the scheduler SCH may transmit the turn-on signal T1 to the power generation unit G and the control unit CON of the matching network MAT.

The control unit CON may perform a second adjustment operation in response to the turn-on signal T1. In other words, a fine calibration step S945 of the capacitance of the variable capacitor may be performed around a first position in response to a change in impedance of the first reactor R1 while a reaction gas is supplied under the second plasma atmosphere. Because the moving unit M is moved to the first position, during the fine calibration operation, the driving unit DRV may move the moving unit M by the second distance that is less than the first distance.

After the reaction gas supply step S940, a reaction gas purge step S950 is performed. During the reaction gas purge step S950, step S955 of moving the moving unit M to a second position may be performed. In addition, plasma power supply may be stopped during the reaction gas purge step S950. Accordingly, the scheduler SCH may transmit the turn-off signal T2 to the power generation unit G and the control unit CON of the matching network MAT.

The control unit CON may perform a first adjustment operation in response to the turn-off signal T2. That is, in order to prevent reflected power that may be generated during the source gas supply step S920 performed by repetition of a cycle, step S955 of setting the capacitance of the variable capacitor to the second value may be performed.

The first adjustment operation and the second adjustment operation described above may be alternately performed by repetition of the cycle. In some embodiments, from the second and subsequent cycles, in step S925, which is the second adjustment operation performed during the source gas supply step S920, the moving unit M may be finely calibrated around the second position. In some embodiments, the initial position and the second position may be substantially the same.

Figure 10:
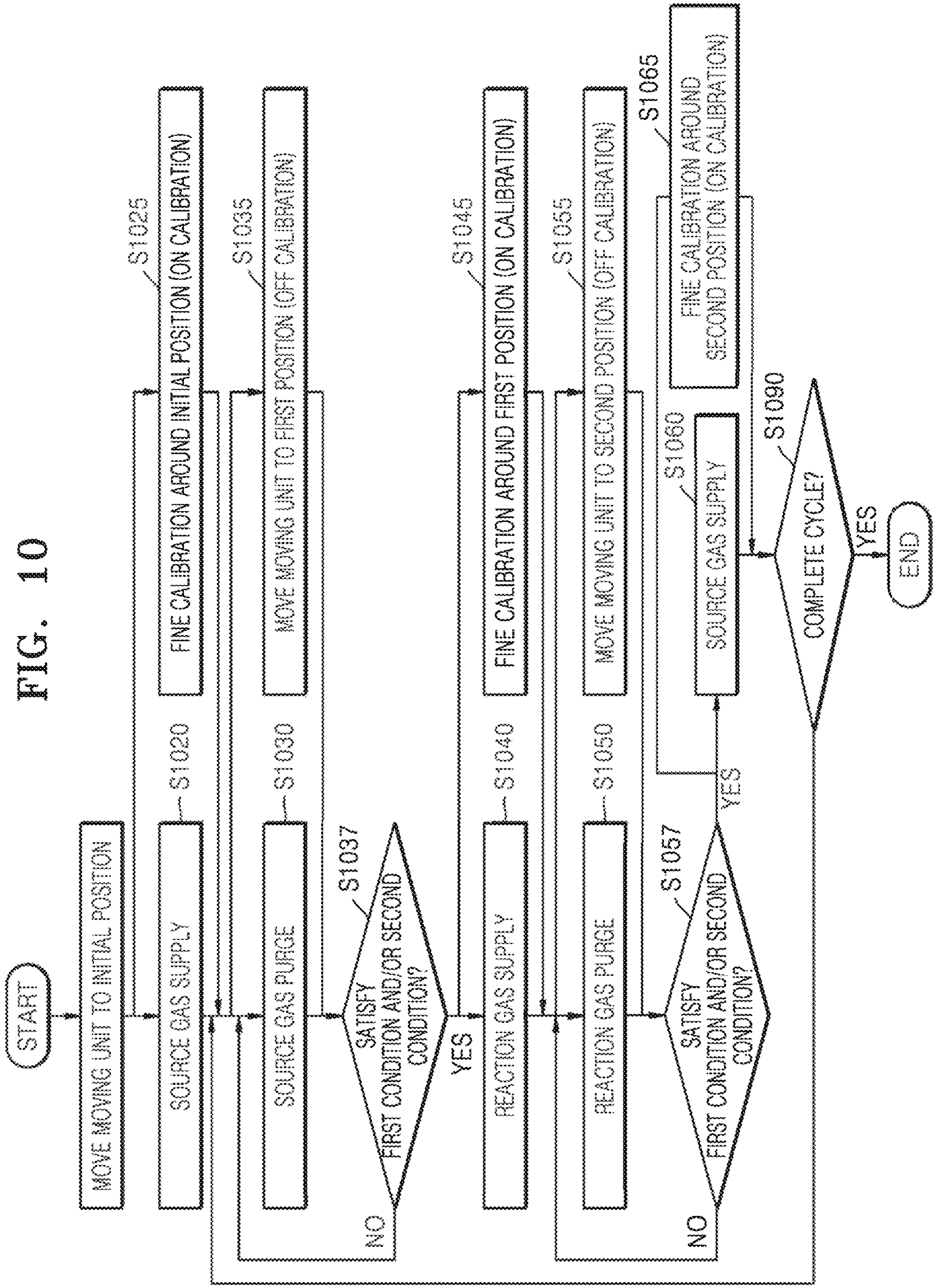
FIG. 10 is a flowchart schematically illustrating a substrate processing method according to embodiments of the inventive concept.
Figure 11:
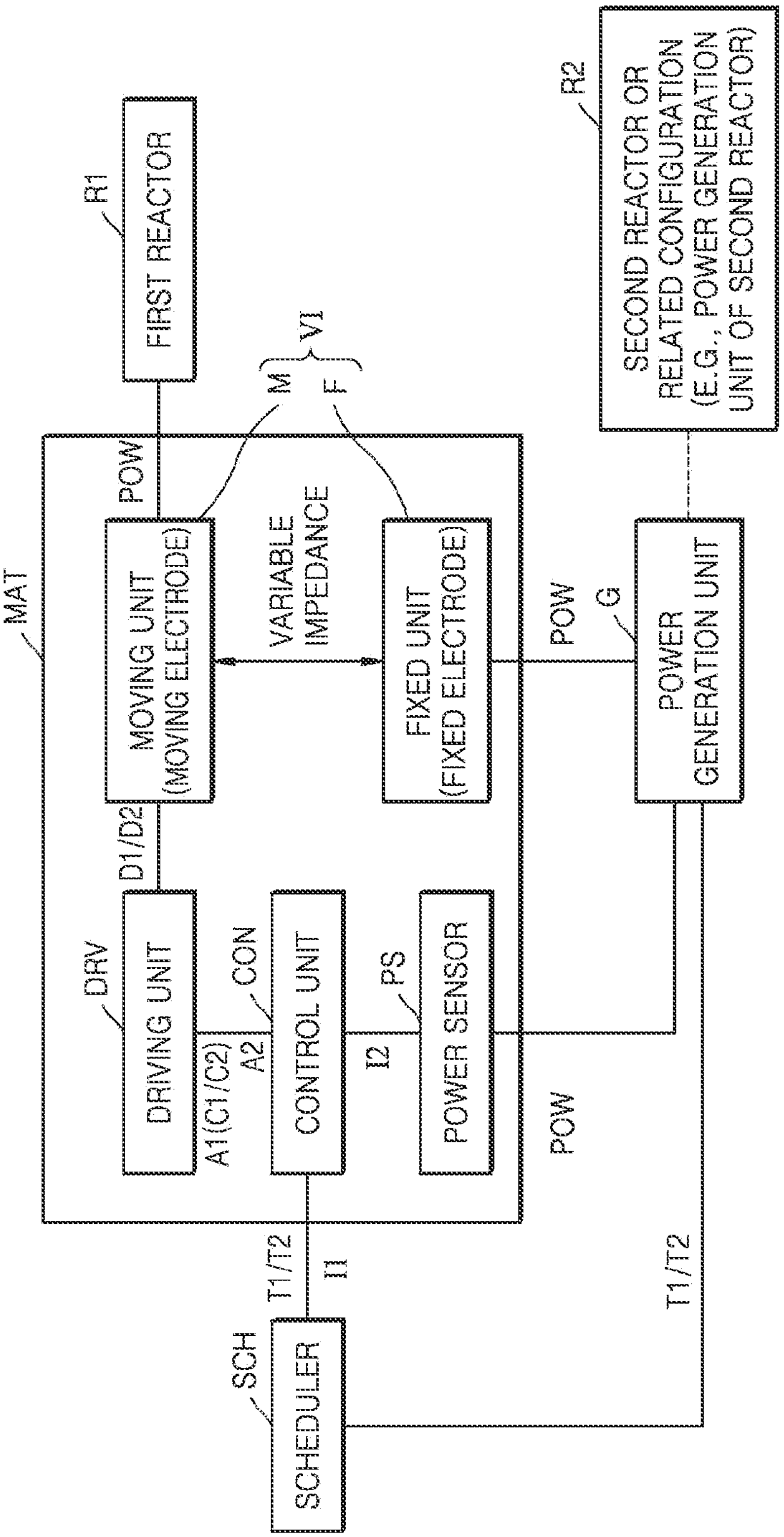
FIG. 11 is a schematic view of a substrate processing apparatus using the substrate processing method of FIG. 10.
Figure 12:
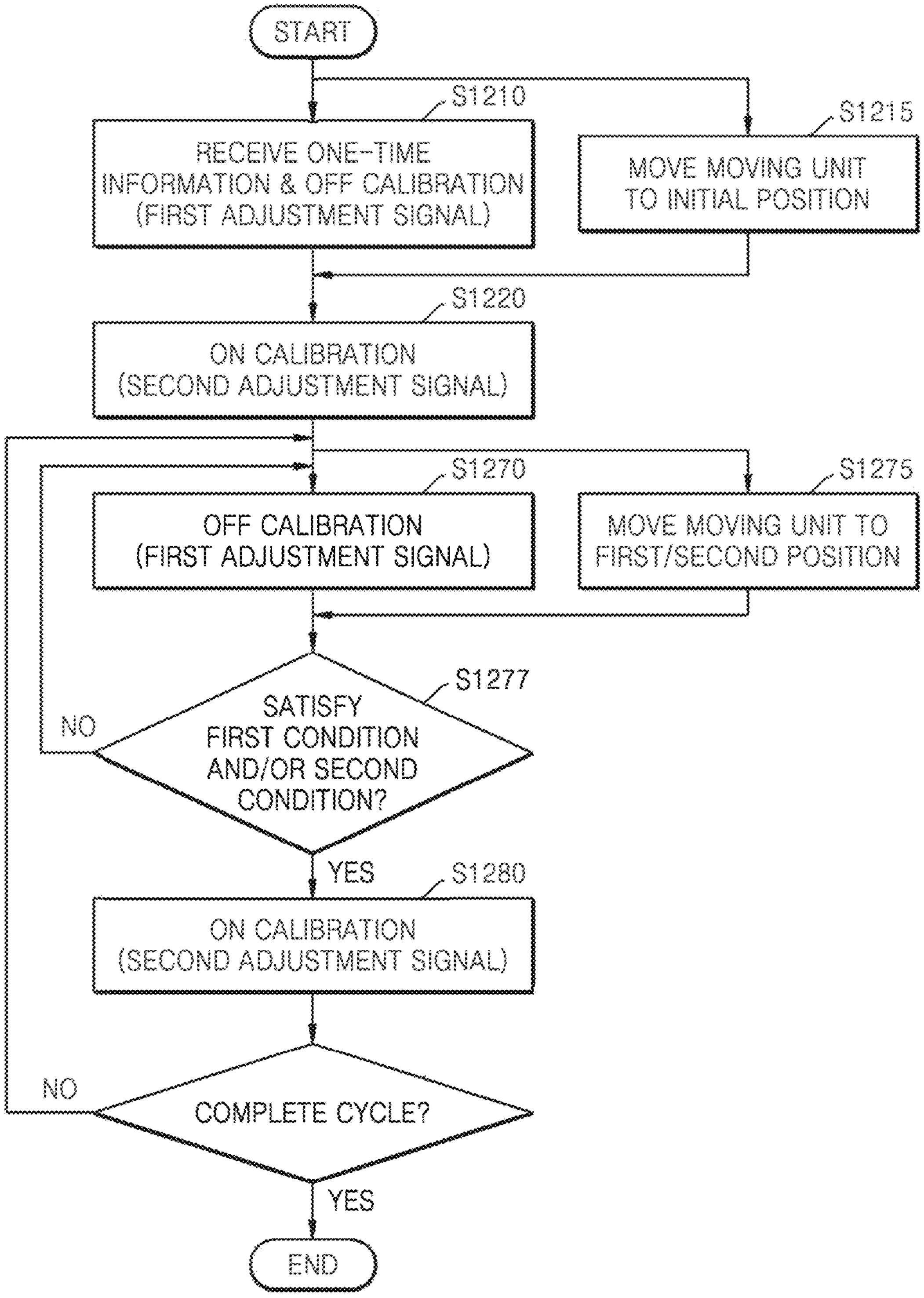
FIG. 12 is a flowchart schematically illustrating operations performed by a control unit of the substrate processing apparatus of FIG. 11.

FIG. 10 is a flowchart schematically illustrating a substrate processing method according to embodiments of the inventive concept. FIG. 11 is a schematic view of a substrate processing apparatus using the substrate processing method of FIG. 10, and FIG. 12 is a flowchart schematically illustrating operations performed by a control unit of the substrate processing apparatus of FIG. 11. The substrate processing method and the substrate processing apparatus according to these embodiments may be variations of the substrate processing method and the substrate processing apparatus according to the previous embodiments. Hereinafter, repeated descriptions of the embodiments are omitted.

Referring to FIG. 10, as in the embodiment of FIG. 5, before performing a reaction gas supply step S1040 after a source gas purge step S1030, step S1037 of determining whether at least one of a first condition and a second condition is satisfied may be performed. In addition, between reaction gas purge step S1050 and step S1090 of determining whether a cycle is completed, step S1057 of determining whether at least one of the first condition and the second condition is satisfied may be performed. To this end, the matching network MAT of the substrate processing apparatus of FIG. 11 may include the power sensor PS, similar to the matching network of the substrate processing apparatus of FIG. 6, and a repeated description is omitted below.

On the other hand, in contrast to the embodiment of FIG. 5, in the embodiment of FIG. 10, before performing the cycle, source gas supply step S1020 may be performed, and the cycle may start from the source gas purge step S1030. In addition, as in the embodiment of FIG. 7, the variable capacitor including a VVC is utilized, and step S1035 of moving the moving unit M to a first position may be performed during the source gas purge step S1030 within the cycle, and step S1055 of moving the moving unit M to a second position may be performed during the reaction gas purge step S1050 within the cycle. To this end, the matching network MAT of the substrate processing apparatus of FIG. 11 may include the fixing unit F, the moving unit M, and the driving unit DRV, similar to the matching network MAT of the substrate processing apparatus of FIG. 8, and a repeated description is omitted below.

In addition, as in the embodiment of FIG. 9, in order to perform a second adjustment operation, during the source gas supply step S1020 and during the reaction gas supply step S1040, fine calibration steps S1025, S1045, and S1065 of the capacitance of the variable capacitor may be performed, and repeated descriptions are omitted below.

Referring to FIG. 10, in some embodiments, during the source gas supply step S1020 performed before the cycle, in step S1025, the driving unit DRV may finely calibrate a position of the moving unit M around an initial position of the moving unit M. Accordingly, the capacitance of the variable capacitor may be dynamically corrected around a value (e.g., a second value) corresponding to the initial position according to a change in process conditions of the first reactor R1 by supply of a source gas.

In addition, during the reaction gas supply step S1040 performed within the cycle, in step S1045, the driving unit DRV may finely calibrate the position of the moving unit M around a first position of the moving unit M. Accordingly, the capacitance of the variable capacitor may be dynamically corrected around a value (e.g., a first value) corresponding to the first position according to the change in process conditions of the first reactor R1 by supply of a reaction gas.

Furthermore, during the source gas supply step S1060 performed within the cycle, in step S1065, the driving unit DRV may finely calibrate the position of the moving unit M around the second position of the moving unit M. Accordingly, the capacitance of the variable capacitor may be dynamically corrected around a value (e.g., the second value) corresponding to the second position according to the change in process conditions of the first reactor R1 by supply of the source gas.

As described above, a first adjustment operation performed during the source gas purge step S1030 and the reaction gas purge step S1050 may be performed in a state in which the supply of plasma power is stopped, whereas the second adjustment operation performed during the source gas supply steps S1020 and S1060 and reaction gas supply step S1040 may be performed in a state in which plasma power is supplied. Hereinafter, reflecting these characteristics, the first adjustment operation will be referred to as 'OFF calibration' and the second adjustment operation will be referred to as 'ON calibration'.

In some embodiments, while performing OFF calibration, the control unit CON may determine whether the first condition and the second condition are satisfied, and may perform ON calibration when both the first condition and the second condition are satisfied. As described above, the first condition may be that the matching network MAT receives the turn-off signal T2 from the scheduler SCH. In some further embodiments, the first condition may be that the received turn-off signal T2 continues for a certain time or more.

In addition, the second condition may be that turn-off duration of the power generation unit G is greater than the time required for capacitance switching of the variable capacitor (i.e., the time required to move the moving unit M to the first position or the time required to move the moving unit M to the second position). To this end, during the OFF calibration, comparing the turn-off duration of the power generation unit G with a preset value related to a moving time of the moving unit (inter-step time) may be performed.

As described above, the first condition and the second condition may be to prevent the pseudo turn-on signal T1 and/or the pseudo turn-off signal T2 from being applied to the control unit CON of the matching network MAT due to noise.

For example, as shown in FIG. 11, although power generation by the power generation unit G needs to be stopped during the OFF calibration, noise may be applied to the power generation unit G of the first reactor R1 by a second reactor or a related configuration such as a power generation unit (not shown) of the second reactor, and the control unit CON of the first reactor R1 during the OFF calibration may be erroneously switched to the ON calibration due to the noise. In other words, due to crosstalk power transmitted from the second reactor adjacent to the first reactor R1, a problem may occur in smooth switching between an ON calibration operation and an OFF calibration operation of the control unit CON.

A substrate processing method according to embodiments of the inventive concept prevents such a problem, and provides a method capable of ensuring smooth switching between the ON calibration operation and the OFF calibration operation without continuous information exchange (i.e., communication) between the scheduler SCH and the matching network MAT. To this end, it is determined whether the first condition and/or the second condition is satisfied, and the switch between the ON calibration operation and the OFF calibration operation is performed based on this determination. Hereinafter, a process of calculating the first condition and the second condition will be described in more detail.

Referring to FIG. 11, the control unit CON of the matching network MAT may receive the first information I1 from the scheduler SCH at an initial stage (e.g., a boot-up operation) once. In some embodiments, the control unit CON may independently control the driving unit DRV without continuous communication with the scheduler SCH, based on the first information I1 and the second information I2 from the power sensor PS, and the turn-on signal T1 and the turn-off signal T2 from the scheduler SCH.

In some embodiments, the control unit CON may determine whether the first condition is satisfied using the turn-off signal T2 (or an inverted signal of the turn-on signal T1) received from the scheduler SCH.

In some embodiments, the first information I1 is a preset value stored in the scheduler SCH, and the value may include a time required to move the moving unit M to the first position or a time required to move the moving unit M to the second position. Accordingly, the control unit CON may calculate a time required for capacitance switching of the variable capacitor from among second conditions by using the first information I1.

In some embodiments, the control unit CON may use a value related to a power level included in the second information I2 received from the power sensor PS to calculate turn-off duration from among the second conditions. In more detail, the control unit CON may calculate the turn-off duration of the power generation unit G by counting a time point at which the value related to the power level is maintained. It may be noted that the value related to the power level received from the power sensor PS is different from the turn-on signal T1 to the turn-off signal T2 received from the scheduler SCH.

In general, the turn-on signal T1 that the control unit CON receives from the scheduler SCH and power level-related values included in the second information I2 generated by the power sensor PS may be the same as, for example, a level 'high (H)', and the turn-off signal T2 that the control unit CON receives from the scheduler SCH and power level-related values included in the second information I2 generated by the power sensor PS may be, for example, a level 'low (L)', but may be different kinds of signals. For example, the power level-related values may be different values depending on a time period due to time difference, and may be instantaneously different from each other due to noise or the like although the power level-related values need to have the same value during a certain time period.

According to embodiments of the inventive concept, the control unit CON may achieve a switching operation of OFF calibration and ON calibration without influence by external noise, by determining whether the first condition and the second condition are satisfied using a combination of i) the turn-on signal T1 to the turn-off signal T2 received from the scheduler SCH and ii) the power level-related values included in the second information I2 generated by the power sensor PS.

In addition, according to embodiments of the inventive concept, the control unit CON is configured to perform the ON calibration as well as the OFF calibration described above. Hereinafter, an operation performed by the control unit CON during a substrate processing method according to embodiments of the inventive concept will be described with reference to FIG. 12.

Referring to FIG. 12, in step S1210, the control unit CON may receive one-time information from the scheduler SCH, and may store the one-time information in an appropriate location (e.g., a memory) in the matching network MAT. In some alternative embodiments, the control unit CON may periodically receive the one-time information from the scheduler SCH. For example, although not shown in the drawings, the control unit CON may receive the one-time information after repeating a certain number of cycles or after processing a certain number of substrates.

The one-time information may include the first information I1 according to the above-described embodiments. That is, the one-time information may include the number of repetitions of a cycle, information about an initial position of the moving unit M, information about a first position of the moving unit M, information about a second position of the moving unit M, and information about a moving time of the moving unit M.

The control unit CON performs a first adjustment operation performed in a state in which the supply of plasma power is stopped based on the one-time information (i.e., an OFF calibration operation in step S1210). The control unit CON may transmit a first adjustment signal to the driving unit DRV so that step S1215 of moving the moving unit M to the initial position may be performed. The driving unit DRV may transmit, to the moving unit M, a driving signal for moving the moving unit M in response to the first adjustment signal.

In some embodiments, the initial position may correspond to the second position, and thus, the control unit CON may transmit the second control signal C2 to the driving unit DRV. The driving unit DRV may transmit, to the moving unit M, the second driving signal D2 for moving the moving unit M in response to the first adjustment signal, and thus, the moving unit M may move to a second position corresponding to the second driving signal D2 to obtain a variable impedance based on a distance between a moving electrode and a fixed electrode.

Thereafter, the control unit CON performs a second adjustment operation (i.e., ON calibration step S1220) performed while plasma power is supplied. The ON calibration operation in step S1220 is fine-adjusting the impedance in response to a process condition change during the processing process as described above, wherein the driving unit DRV may finely move the moving unit M by generating a driving signal in response to a second adjustment signal. Therefore, during source gas supply step of the substrate processing apparatus, matching impedance of the matching network MAT corresponding to changing impedance of the reactor may be implemented.

Thereafter, a cycle starts, and OFF calibration step S1270 is performed. In some embodiments, the OFF calibration step S1270 may be performed in response to the power sensor PS detecting low-level power from the power generation unit G. During the OFF calibration step S1270, in step S1275, the control unit CON may transfer the first adjustment signal (i.e., the first control signal C1 or the second control signal C2) to the driving unit DRV to move the moving unit M to the first position or the second position.

Thereafter, before performing the ON calibration step S1280 performed by the second adjustment signal, step S1277 of determining whether the first condition and the second condition are satisfied is performed. That is, the control unit CON may not perform the ON calibration step S1280 until the movement of the moving unit M to the first or second position is completed, and this is to prevent the control unit CON from being influenced by noise as described above.

Figure 13:
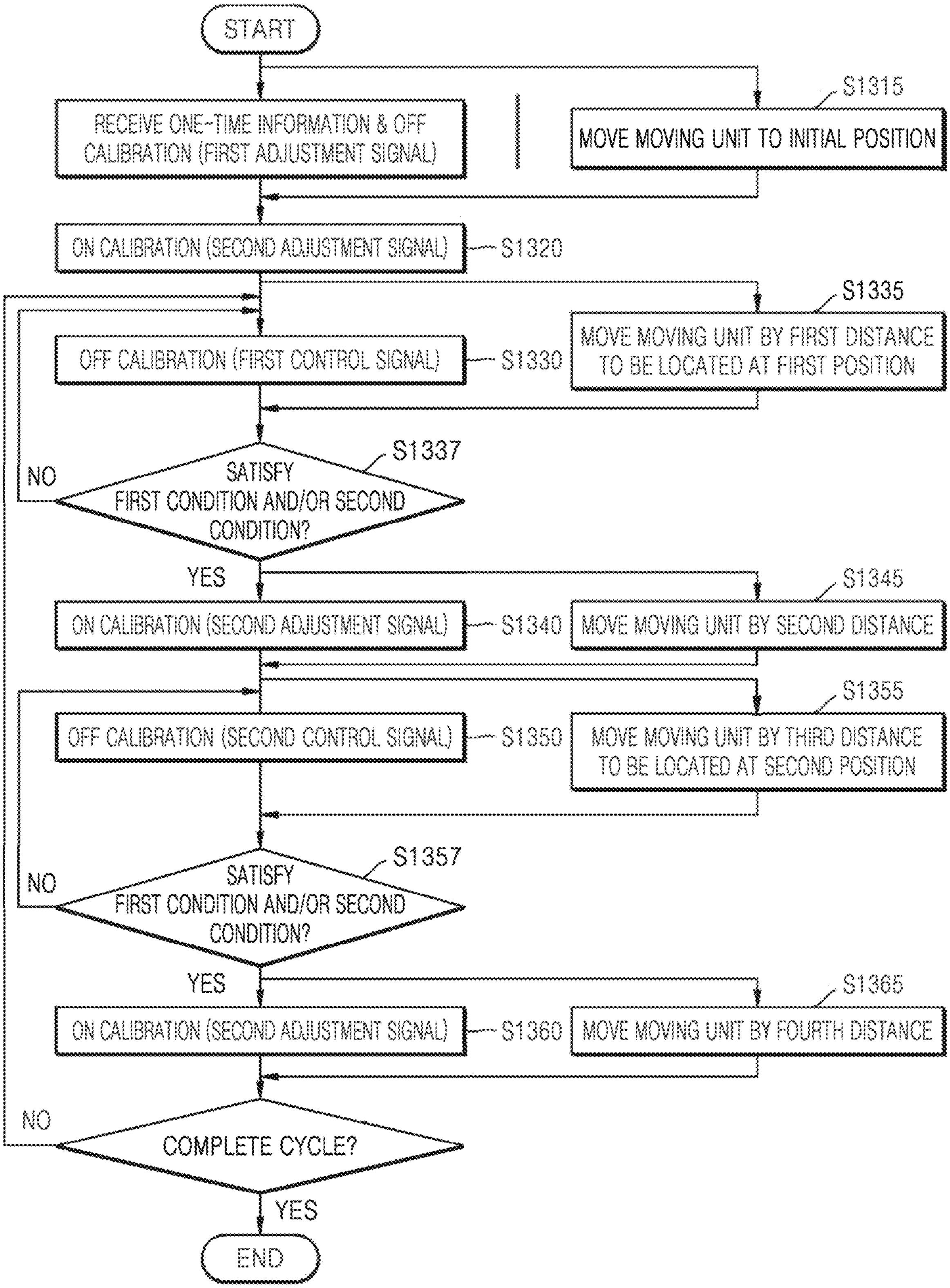
FIG. 13 is a flowchart illustrating the substrate processing method of FIG. 12 in more detail.

FIG. 13 shows the substrate processing method of FIG. 12 in more detail, and is a flowchart illustrating movement of the moving unit M performed during the OFF calibration (S1270 in FIG. 12) and the ON calibration (S1280 in FIG. 12), dividing each OFF/ON calibration into a case of a first position and a case of a second position respectively.

Referring to FIG. 13, because operations before a cycle correspond to steps of FIG. 12, a redundant description thereof is omitted. After ON calibration (S1320, operation of the control unit CON during a source gas supply step before entering a cycle), the control unit CON enters the cycle to perform OFF calibration (S1330, operation of the control unit CON during a source gas purge step in the cycle), and during the OFF calibration (S1330), in step S1335, the control unit CON moves the moving unit M by a first distance to be located at the first position.

Thereafter, in step S1337, it is determined whether the first condition and the second condition are satisfied, and when both the first condition and the second condition are satisfied, ON calibration (S1340, operation of the control unit CON during reaction gas supply step) is performed. During the ON calibration (S1340), in step S1345, the control unit CON moves the moving unit M by a second distance so that the moving unit M is finely adjusted around the first position. As described above, the second distance for fine adjustment is less than the first distance.

Thereafter, OFF calibration (S1350, operation of the control unit CON during a reaction gas purge step in the cycle) is performed, and during the OFF calibration (S1350), in step S1355, the control unit CON moves the moving unit M by a third distance to be located at the second position. In some embodiments, an initial position to which the moving unit M moves during step S1315 and the second position to which the moving unit M moves during step S1355 may be the same. In this case, the first distance and the third distance may be substantially the same. In other words, the first distance between the initial position and the first position and the second distance between the first position and the second position may be equal to each other.

Thereafter, in step S1357, it is determined whether the first condition and the second condition are satisfied, and when both the first condition and the second condition are satisfied, ON calibration (S1360, operation of the control unit CON during the source gas supply step) is performed. During the ON calibration (S1360), in step S1365, the control unit CON moves the moving unit M by a fourth distance so that the moving unit M is finely adjusted around the second position. The fourth distance for fine adjustment may be less than the third distance.

Figure 14:
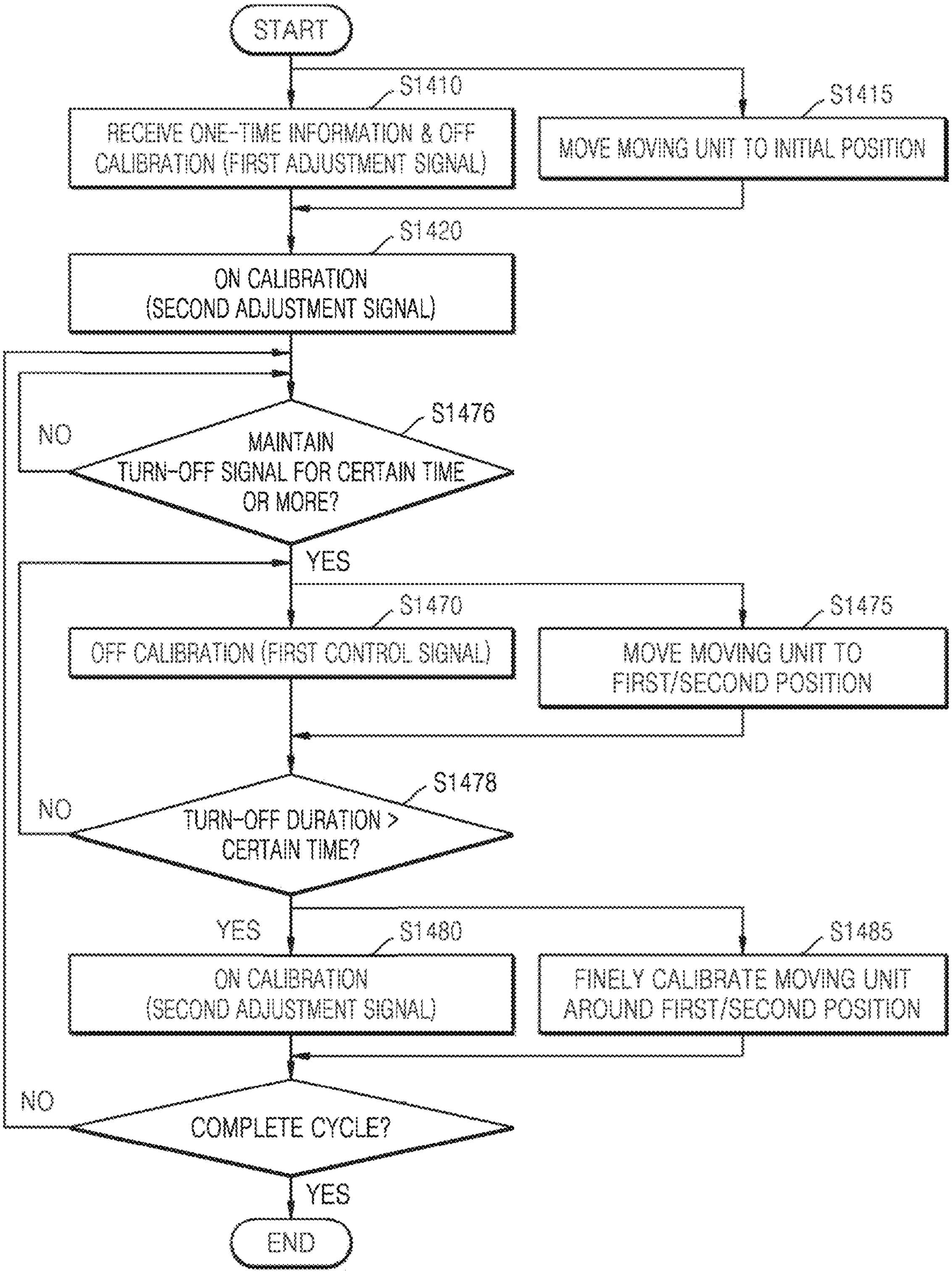
FIG. 14 is a flowchart illustrating an operation performed by a control unit while performing a substrate processing method according to embodiments of the inventive concept.

FIG. 14 is a flowchart illustrating an operation performed by a control unit while performing a substrate processing method according to embodiments of the inventive concept. The substrate processing method according to these embodiments may be variations of the substrate processing method according to the embodiments illustrated in FIG. 12. Hereinafter, repeated descriptions of the embodiments are omitted.

Referring to FIG. 14, after a cycle starts (i.e., after steps S1410 and S1415 of moving the moving unit M to an initial position and performing OFF calibration and after ON calibration (S1420) during a source gas supply step), in step S1476, it is determined whether the turn-off signal T2 received from the scheduler SCH is maintained for a certain time or more before performing OFF calibration step S1470. This determination step S1476 is to prevent the matching network MAT from proceeding to the next operation (OFF calibration (S1470)) due to the pseudo turn-off signal T2 even though the matching network MAT should be performing the ON calibration (S1420) when the pseudo turn-off signal T2 flows into the control unit CON of the matching network MAT of the first reactor R1 due to noise generated by an adjacent reactor.

When the turn-off signal T2 received from the scheduler SCH to the control unit CON is maintained for a certain time or more, the OFF calibration (S1470) is performed. The OFF calibration (S1470) may be performed during a source gas purge step. A first adjustment signal is generated during the OFF calibration (S1470) and the moving unit M moves to the first or second position (S1475) as described above. Thereafter, before performing the ON calibration (S1480) performed by a second adjustment signal, step S1478 of determining whether turn-off duration is equal to or greater than a certain value is performed.

In step S1478, in order to determine whether the turn-off duration of the power generation unit G is equal to or greater than a certain value, the power sensor PS of the matching network MAT may be configured to detect low-level power from the power generation unit G, and the control unit CON may calculate the turn-off duration of the power generation unit G based on a period during which the power sensor PS detects the low level power. The turn-off duration calculated in this way is compared with a certain value (a value related to a moving time of the moving unit M described above), and if the turn-off duration is greater than the certain value, ON calibration (S1480) is performed. The ON calibration (S1480) may be performed during a reaction gas supply step.

This determination step S1478 is to prevent the matching network MAT from proceeding to the next operation (ON calibration (S1480)) due to noise power even though the matching network MAT should be performing the OFF calibration (S1470) when the noise power of high level flows into the control unit CON of the matching network MAT of the first reactor R1 due to noise generated by an adjacent reactor. In other words, even when the control unit CON receives the turn-on signal T1 from the scheduler SCH and/or detects high-level power from the power generation unit G, the ON calibration (S1480) is performed only when the turn-off duration is greater than a certain value, so that the influence by noise may be prevented.

When the turn-off duration of the power generation unit G is maintained for a certain time or more, the ON calibration (S1480) is performed. As described above, a second adjustment signal is generated during the ON calibration (S1480) so that the moving unit M is finely calibrated around the first position or the second position in step S1485. Thereafter, it is determined whether the cycle is complete, and the operation of the control unit CON is terminated or the cycle is repeated.

Figure 15:
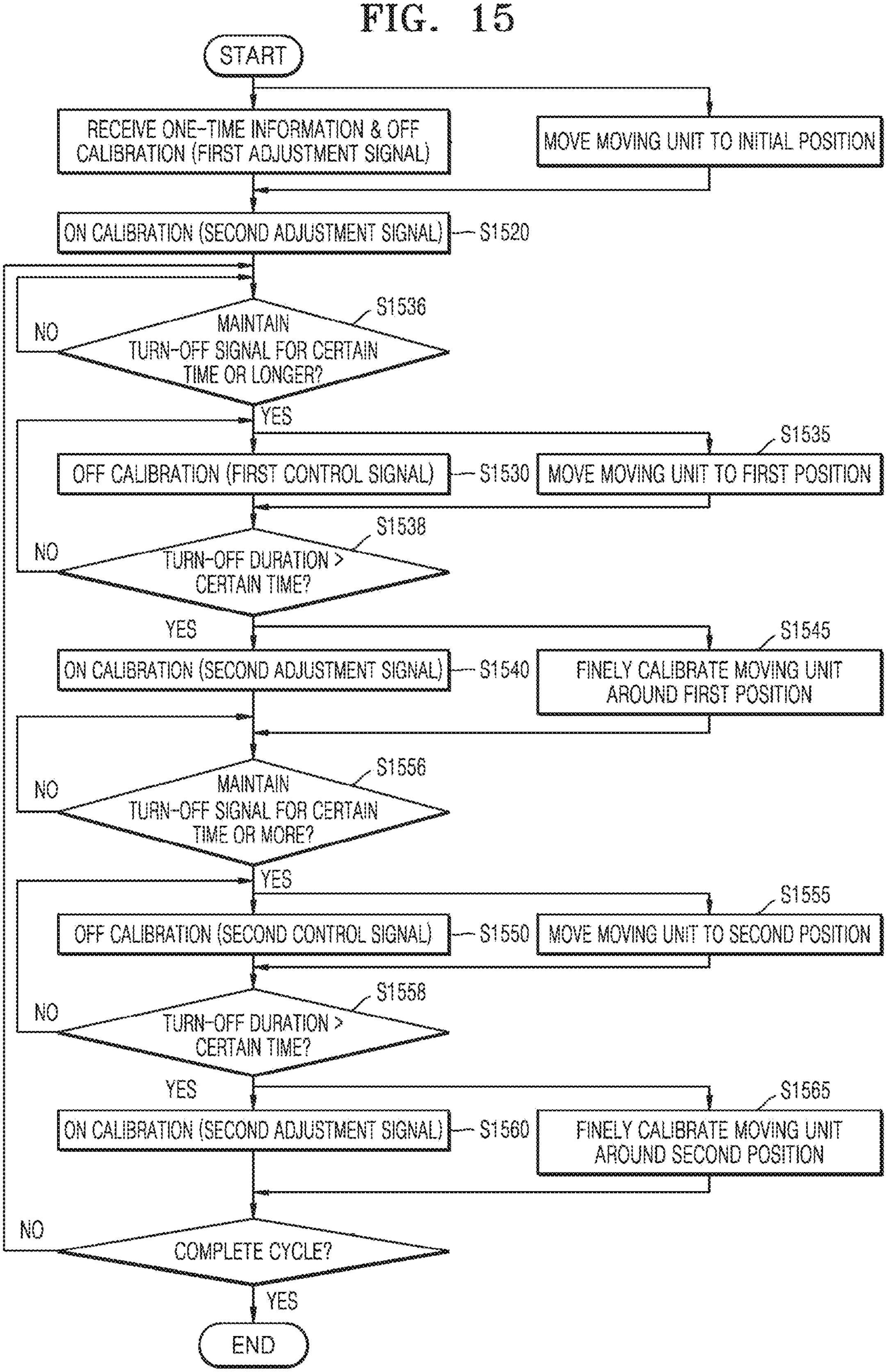
FIG. 15 is a flowchart illustrating the substrate processing method of FIG. 14 in more detail.

FIG. 15 shows the substrate processing method of FIG. 14 in more detail, and is a flowchart illustrating movement of the moving unit M performed during the OFF calibration (S1470 in FIG. 14) and the ON calibration (S1480 in FIG. 14), dividing each OFF/ON calibration into a case of a first position and a case of a second position respectively.

Referring to FIG. 15, because operations before a cycle correspond to steps of FIG. 14, a redundant description thereof is omitted. After ON calibration (S1520) (operation of the control unit CON in a source gas supply step), a cycle begins. During the cycle, OFF calibration (S1530) (operation of the control unit CON in a source gas purge step) is performed, but before entering the OFF calibration (S1530), in step S1536, it is determined whether the turn-off signal T2 from the scheduler SCH is maintained over a certain signal in order to filter a noise signal.

Although not shown in the drawings, in some alternative embodiments, when turn-on duration from the power generation unit G (i.e., a time when high-level power is detected) is equal to or greater than a certain value, the control unit CON may perform the OFF calibration (S1530).

When the turn-off signal T2 from the scheduler SCH is maintained above a certain value, the control unit CON determines that the turn-off signal T2 is not the pseudo turn-off signal T2, and performs OFF calibration (S1530)

(i.e., the operation of the control unit CON in the source gas purge step). During the OFF calibration (S1530), in step S1535, the control unit CON transfers the first control signal C1 to the driving unit DRV, and the driving unit DRV may move the moving unit M to the first position in response to the first control signal C1.

Thereafter, in step S1538, it is determined whether turn-off duration of the power generation unit G is maintained for a certain time or more, and when the turn-off duration is maintained fora certain time or more, ON calibration (S1540) (operation of the control unit CON during a reaction gas supply step) is performed. During the ON calibration (S1540), in step S1545, the control unit CON finely adjusts the moving unit M around the first position.

Thereafter, OFF calibration (S1550) (the operation of the control unit CON during the reaction gas purge step) is performed again, but before entering the OFF calibration (S1550), in step S1556, it is determined whether the turn-off signal T2 from the scheduler SCH is maintained over a certain signal in order to filter a noise signal. When the turn-off signal T2 from the scheduler SCH is maintained for a certain value or more, the OFF calibration (S1550) (i.e., the operation of the control unit CON during the reaction gas purge step) is performed. During the OFF calibration (S1550), in step S1555, the control unit CON transfers the second control signal C2 to the driving unit DRV, and the driving unit DRV may move the moving unit M to the second position in response to the second control signal C2.

Thereafter, in step S1558, it is determined whether the turn-off duration of the power generation unit G is maintained for a certain time or more, and when the turn-off duration is maintained for a certain time or more, ON calibration (S1560) (the operation of the control unit CON in the source gas supply step) is performed. During the ON calibration (S1560), in step S1565, the control unit CON finely adjusts the moving unit M around the second position.

Figure 16:
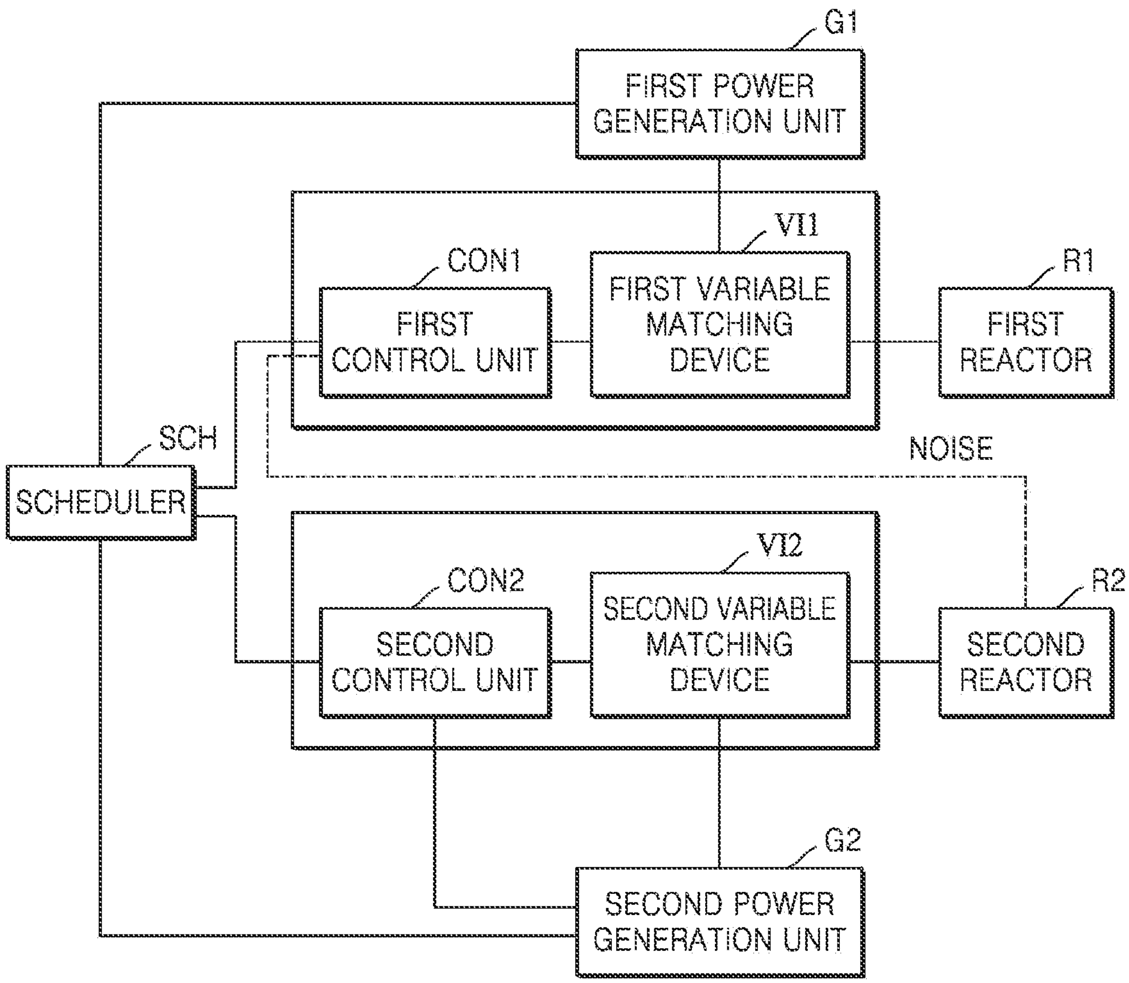
FIG. 16 is a view illustrating a case in which a malfunction of a first control unit occurs due to noise in a substrate processing apparatus configured to process a plurality of reactors.

FIG. 16 illustrates a case in which a malfunction of a first control unit CON1 occurs due to noise in a substrate processing apparatus configured to process a plurality of reactors.

Referring to FIG. 16, for example, when processes of different plasma conditions are continuously performed in a substrate processing method and impedance matching corresponding to each of these plasma conditions is required, a change in impedance matching is required according to process progress (i.e. switching of plasma conditions). Because the first control unit CON1 of a first matching network MAT1 for controlling impedance matching operates independently from the scheduler SCH, the first control unit CON1 needs to operate depending on a reference signal received at the time of switching the impedance matching.

For example, the first control unit CON1 of the first matching network MAT1 may receive the turn-off signal T2 from the scheduler SCH as a reference signal to initiate an impedance switching operation (e.g., movement of a moving unit). However, when this turn-off signal is a pseudo turn-off signal T2' generated by noise (e.g., crosstalk power transferred from a second reactor) generated by an adjacent reactor, the first control unit CON1 of the first matching network MAT1 starts an impedance switching operation at an inappropriate time, which may cause process failure.

According to embodiments of the inventive concept, the first control unit CON1 is configured to determine whether at least one of a first condition in which the first control unit CON1 receives a turn-off signal from the scheduler SCH and a second condition that turn-off duration of a first power generation unit G1 is greater than a time required for capacitance switching of the variable capacitor. Therefore, even if noise generated by a second reactor R2 is applied to the first control unit CON1 as a pseudo reference signal through other components such as a second control unit CON2, a second variable matching device VI2, and a second power generation unit G2, malfunction of the first control unit CON1 may be prevented.

Figure 17:
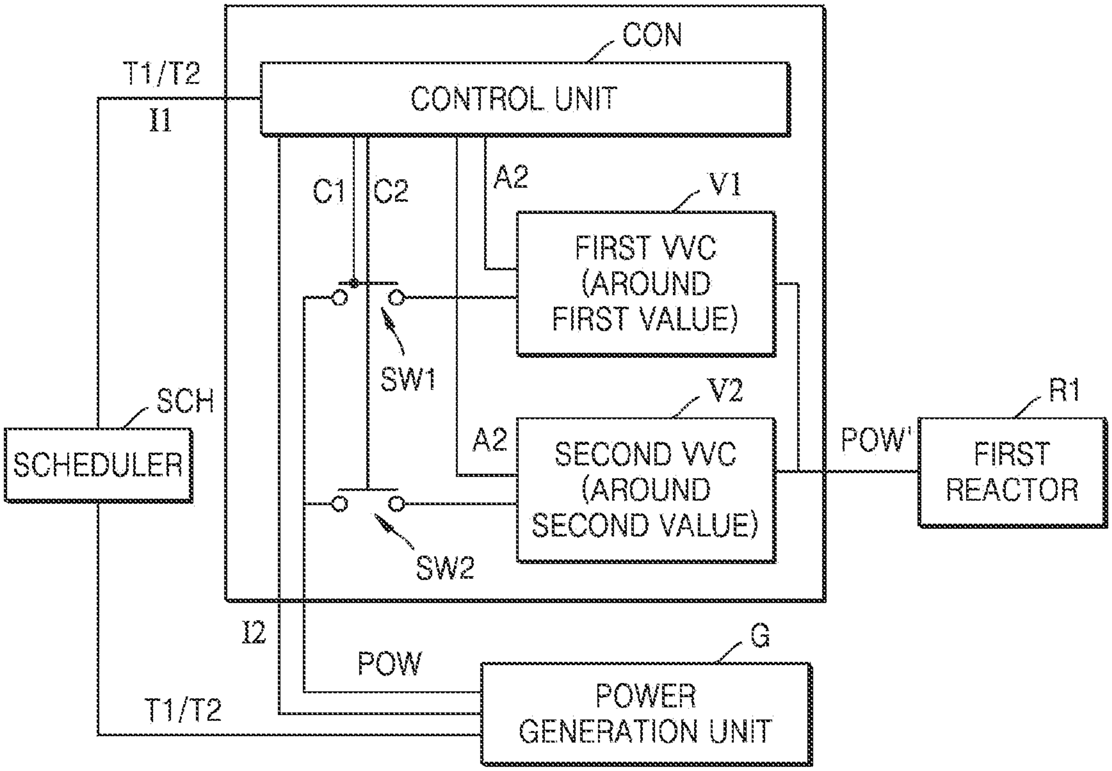
FIG. 17 is a schematic view of a substrate processing apparatus according to embodiments of the inventive concept.

FIG. 17 is a schematic view of a substrate processing apparatus according to embodiments of the inventive concept. The substrate processing apparatus according to the embodiments may be one of variations of the substrate processing apparatus according to the above-described embodiments. Hereinafter, repeated descriptions of the embodiments are omitted.

Referring to FIG. 17, a variable matching device in the matching network MAT of the substrate processing apparatus may include a first VVC (Vacuum Variable Capacitor) V1, a second VVC V2, a first switch SW1 connecting between the power generation unit G and the first VVC V1, and a second switch SW2 connecting the power generation unit G and the second VVC V2. The control unit CON may be configured to turn on/off the first switch SW1 and the second switch SW2 through the first control signal C1 and the second control signal C2.

A first adjustment operation (i.e., OFF calibration) in the above-described embodiments may be achieved through switching operations of the first switch SW1 and the second switch SW2. For example, the moving unit M of the first VVC V1 may be set to a position having a first value of a variable capacitance, and the moving unit M of the second VVC V2 may be set to a position having a second value of a variable capacitance. In some embodiments, the control unit CON may turn on the first switch SW1 and turn off the second switch SW2 to perform OFF calibration during a source gas purge operation. In another embodiment, the control unit CON may turn off the first switch SW1 and turn on the second switch SW2 to perform OFF calibration during a reaction gas purge operation.

Because an OFF calibration operation is performed only by switching operations of the first switch SW1 and the second switch SW2, a time required for the OFF calibration operation may be reduced. In the case of the above-described OFF calibration operation in the previous embodiments, a fluctuation range of capacitance is large and a movement distance of a VVC is large. Accordingly, in the embodiment according to FIG. 17, a time required for the OFF calibration operation performed may be reduced compared with the OFF calibration by moving a moving unit of the VVC to a first position or a second position.

During a second adjustment operation (i.e., ON calibration) after the first adjustment operation, the control unit CON may transmit a second adjustment signal to the first VVC V1 or the second VVC V2. For example, the control unit CON may transmit the second adjustment signal to the first VVC V1 to perform ON calibration during a reaction gas supply operation. In another embodiment, the control unit CON may transmit the second adjustment signal to the second VVC V2 to perform ON calibration during a source gas supply operation.

Figure 18:
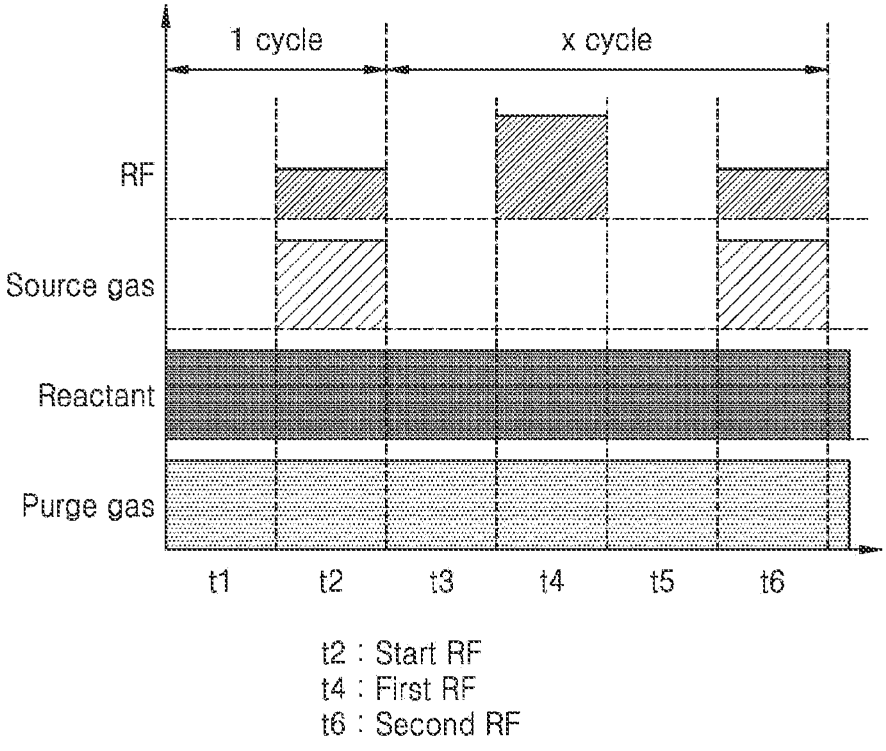
FIGS. 18 and 19 are views schematically illustrating a substrate processing method according to embodiments of the inventive concept.
Figure 19:
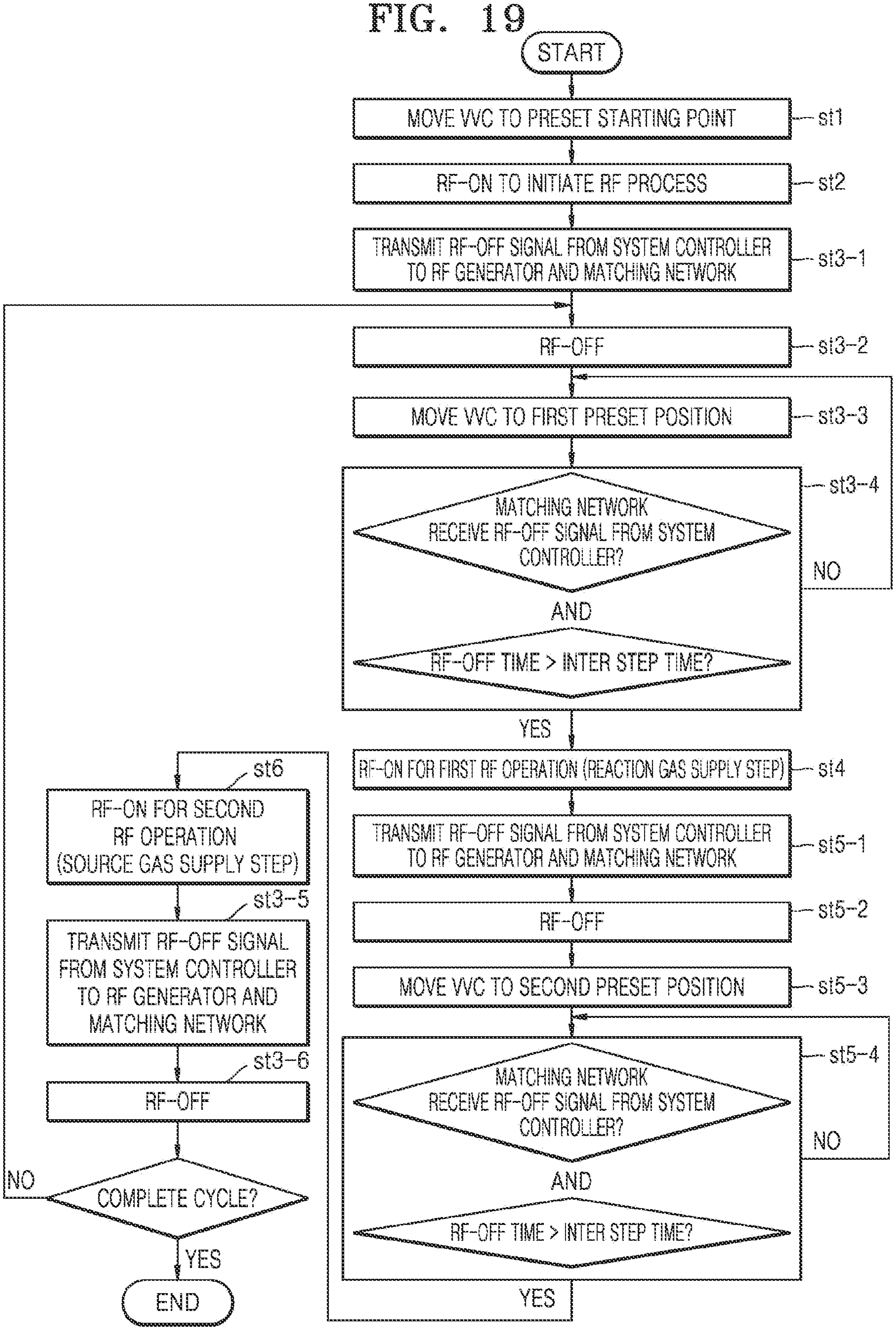

FIGS. 18 and 19 are views schematically illustrating a substrate processing method according to embodiments of the inventive concept. The substrate processing method according to the embodiments may be a variation of the substrate processing method according to the above-described embodiments. Hereinafter, repeated descriptions of the embodiments are omitted.

Referring to FIG. 18, the substrate processing method may include a first cycle performed once and a second cycle performed a plurality of times. The first cycle may include purge step t1 and source gas supply step t2). By applying initiating RF power to a reactor during the source gas supply step t2, a plasma atmosphere may be formed. The source gas supply step t2 may correspond to the source gas supply step S1020 of FIG. 10.

Thereafter, a second cycle is performed, and the second cycle may include source gas purge step t3, reaction gas supply step t4, reaction gas purge step t5, and source gas supply step t6. These steps may correspond to source gas purge step S1030, reaction gas supply step S1040, reaction gas purge step S1050, and source gas supply step S1060 of FIG. 10, respectively, and repeated descriptions are omitted below.

According to some embodiments, initiating RF power may be supplied during the source gas supply step t2 of the first cycle. In addition, first RF power may be supplied during the reaction gas supply step t4 of the second cycle, and second RF power may be supplied during the source gas supply step t6 of the second cycle. In another embodiment, the initiating RF power and the second RF power may be equal to each other.

FIG. 19 is a flowchart illustrating a state in which the substrate processing method of FIG. 18 is performed together with a control operation of a matching network. Hereinafter, the substrate processing method will be described on the premise that a variable matching device of the matching network is implemented as a VVC.

Referring to FIG. 19, in step st1, first, during a purge step, a VVC of the matching network moves to a preset starting point. Thereafter, in step st2, during a source gas supply operation, an RF-on operation is performed to initiate an RF process. Thereafter, during a source gas purge step, step st3-1 of first transmitting an RF-off signal from a system controller (scheduler) to an RF generator and the matching network is performed, in step st3-2, RF power is turned off, and in step st3-3, the VVC is moved to a first preset position.

Before performing the RF-on step st4) for a reaction gas supply step, that is, a first RF step, in step st3-4, it is determined whether the matching network receives an RF-off signal from the system controller (scheduler), and also whether an RF-off time when a power level of the RF generator is low is greater than an inter step time that is a time required for VVC movement. That is, in step st3-4, it is determined whether the time when the power level of the RF generator remains low is greater than a physical time for the VVC to move to a preset point.

When the matching network receives the RF-off signal from the scheduler and the RF-off time is greater than the inter step time, an RF-on step st4 for the reaction gas supply step is performed. In the opposite case, the existing state may be maintained until the above-described conditions are satisfied, and step st3-3 of moving the VVC to a first point may be continued.

After the reaction gas supply step, during a reaction gas purge step, step st5-1 of first transmitting an RF-off signal from the system controller (scheduler) to the RF generator and the matching network is performed, in step st5-2, RF power is turned off, and in step st5-3, the VVC is moved to a second preset position.

Before performing RF-on step st6 for a subsequent source gas supply step, that is, a second RF step, in step st5-4, it is determined whether the matching network receives an RF-off signal from the system controller (scheduler), and also whether an RF-off time is greater than an inter step time. When the matching network receives the RF-off signal from the system controller (scheduler) and the RF-off time is greater than the inter step time, an RF-on step st6 for the source gas supply step is performed. In the opposite case, the existing state may be maintained until the above-described conditions are satisfied, and step st5-3 of moving the VVC to the second point may be continued.

After the source gas supply step, during a source gas purge step, step st3-5 of transmitting the RF-off signal from the system controller (scheduler) to the RF generator and the matching network is performed, thereafter, in step st3-6, RF power is turned off, and the above-described steps are repeated until the cycle ends.

Figure 20:
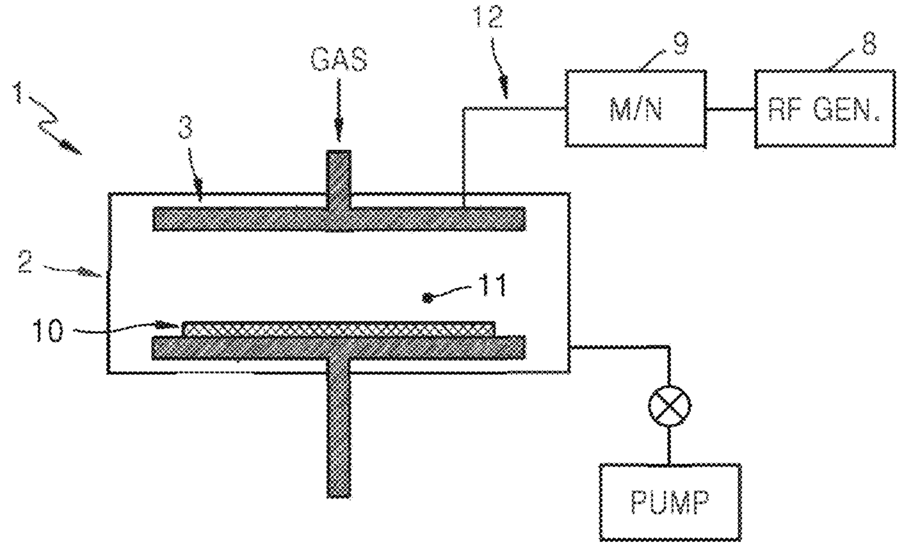
FIG. 20 is a schematic view of a substrate processing apparatus in which a plasma process is performed.

FIG. 20 is a schematic view of a substrate processing apparatus in which a plasma process is performed.

Referring to FIG. 20, in a substrate processing apparatus 1, a reactor 2 is connected to an RF power generator 8 and a matching network 9. When a substrate 10 is processed, RF power generated by the RF power generator 8 is supplied to a reaction space 11 and dissociates gases supplied in the reaction space 11 to generate plasma. The matching network 9 matches impedances inside the RF power generator 8, a transmission line 12, and the reactor 2 so that power generated by the RF power generator 8 may be transmitted to the inside of the reactor 2 as much as possible. That is, by maximizing forward power for plasma generation and minimizing reflected power, which is dissipated power, transmitted power from the RF power generator 8 into the reactor 2 is maximized to keep plasma spatially uniform and stable.

Figure 21A:
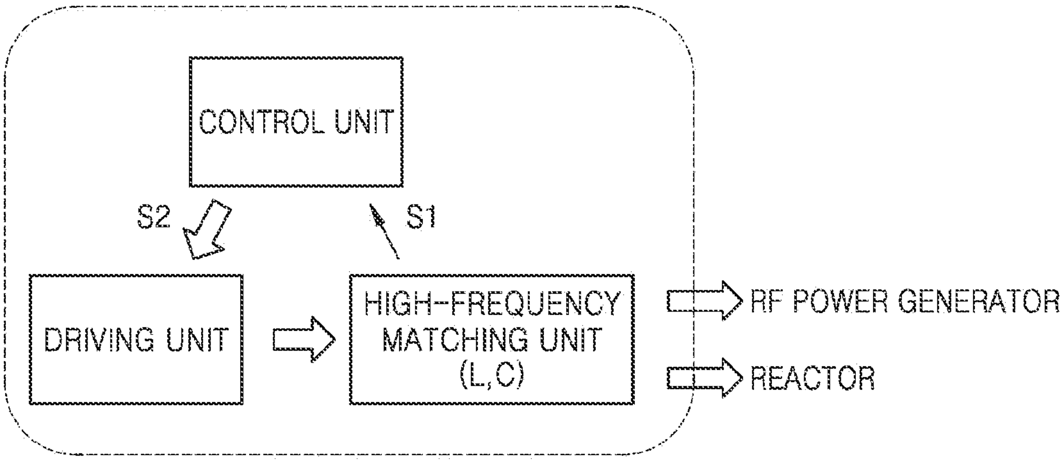
FIGS. 21A and 21B are views respectively illustrating a general configuration and an actual appearance of a matching network.
Figure 21B:
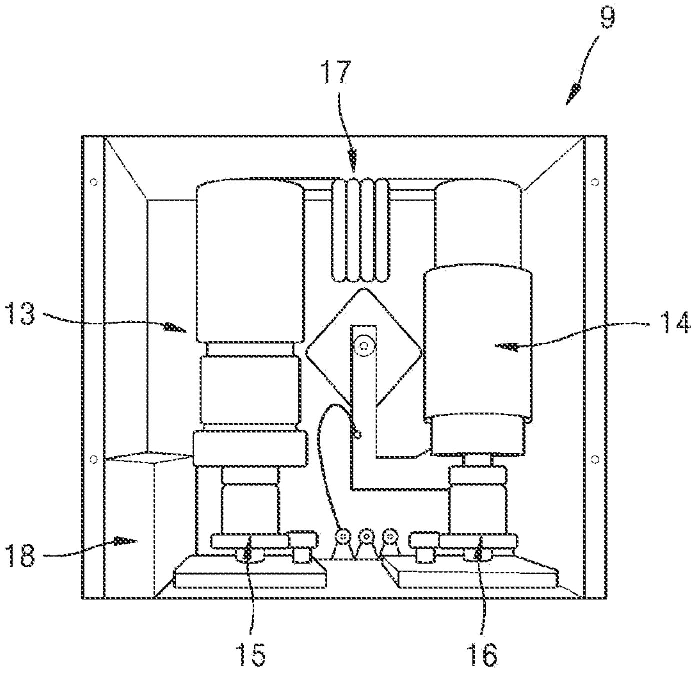

FIGS. 21A and 21B are views respectively illustrating a general configuration and an actual appearance of the matching network 9.

The configuration and function of each part in FIGS. 21A and 21B are as follows.

a. High-frequency matching unit: The high-frequency matching unit includes inductors (L in FIG. 21A and 17 in FIG. 21B) and variable capacitors (C in FIG. 21A, 13 and 14 in FIG. 21B), which are matching devices for impedance matching, and performs a function of preventing malfunction and operation failure of a matching network due to power loss and reflected power caused by impedance mismatch between an RF power generator and a reactor.

b. Driving unit: The driving unit includes a motor (driving motor) and a gear that transmits a rotational force of the motor to the high-frequency matching unit, and performs a function of matching impedance between an RF power generator and a reactor by mechanically changing an inductance value and a capacitance value of the high-frequency matching unit. In an example, the driving unit may include a first driving motor 15 for driving a first VVC 13 and a second driving motor 16 for driving a second VVC 14.

c. Control unit 18: Impedance of a reactor is changed by a minute environmental change (temperature, flow, pressure, and RF power conditions, etc.) in the reactor. The control unit 18 detects the magnitude of reflected power and reflected index according to the change in impedance, and performs a function of instructing a driving unit to appropriately adjust the capacitance of a high-frequency matching unit. The command program for the function of instruction is stored in a read-only-memory (ROM) of the control unit 18 and may be in the form of an algorithm or firmware.

That is, in step S1, as process conditions in the reactor change, the impedance and the magnitude of RF reflected power and reflected index in the reactor change, and the control unit 18 detects the changes. Thereafter, in step S2, the control unit 18 controls mechanical movement of a motor and a gear of a driving unit according to the magnitude of the RF reflected power and the reflected index. Accordingly, the high-frequency matching unit controls a matching device to change impedance and match the impedance with the impedance in the reactor.

On the other hand, in a substrate processing process in which gas supply fluctuates frequently, as process variables such as gas supply flow rate, exchange cycle, and RF power supply cycle are changed frequently and the cycle is shortened to increase a substrate processing speed, the frequency of impedance mismatch between the RF power generator and the reactor increases, and malfunctions of a matching network, operation failures, and defects in the substrate processing process increase due to reflected power. For example, a part of RF power supplied from the RF power generator to the reactor is lost as reflected power, and actual RF power used for substrate processing is less than the original RF power, i.e. set RF power, so that the desired characteristics cannot be obtained in a device element and an element defect rate increases.

Therefore, in the disclosure, in a plasma substrate processing process in which RF power of different magnitudes is periodically applied in the form of a pulse and the application cycle is short, a processing apparatus for minimizing reflected power and performing fast impedance matching and a method of performing the same will be described.

Figure 22:
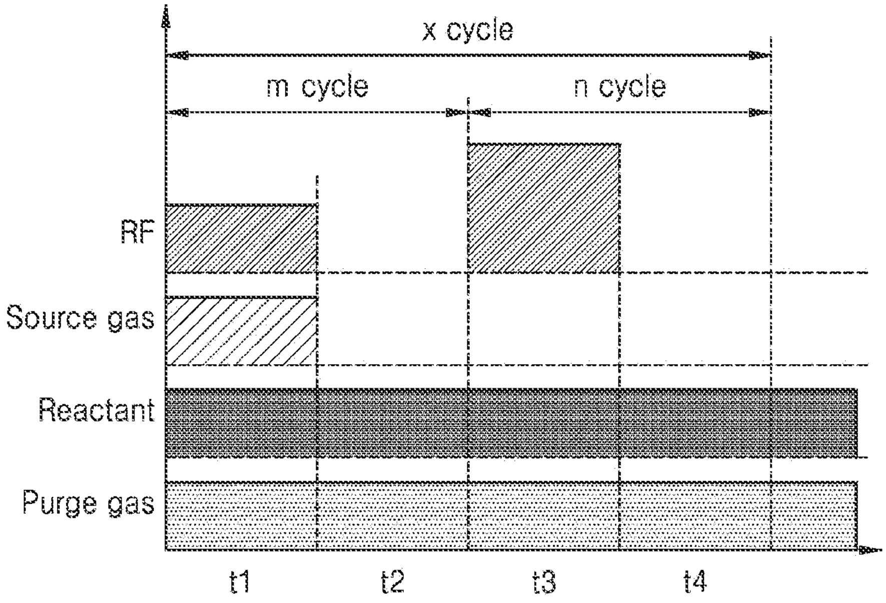
FIG. 22 is a view illustrating a substrate processing method according to an embodiment.

FIG. 22 is a view illustrating a substrate processing method according to an embodiment.

FIG. 22 is a substrate processing process for implementing the disclosure including a plurality of RF power supply steps, wherein the substrate processing process consists of a deposition step and a post-treatment step. The deposition step consists of a source gas, reaction gas, and first RF power supply step t1 and a first purge step t2. The post treatment step consists of a second RF power supply step t3 for plasma-treating a film formed on a substrate in a deposition step and a second purge step t4. In the post-treatment step, there is a technical effect of controlling properties of the film, for example, a wet etch rate (WER). In the deposition step t1 of FIG. 22, by supplying the source gas, the reaction gas, and RF power together, a purge step between the source gas and the reaction gas may be omitted. Accordingly, substrate-processing speed, for example, a film growth rate may be increased. In an embodiment, in order to uniformly form a film on a substrate including a gap structure or a three-dimensional structure, the RF power supplied in the deposition step is supplied in a magnitude sufficient to induce a surface reaction between the source gas and the reaction gas on the substrate while minimizing a gas phase reaction between the source gas and the reaction gas. Therefore, there is a technical effect that may improve the uniformity and a high growth rate of a thin film at the same time.

In FIG. 22, the magnitude of RF power supplied to the deposition step and the post-treatment step may be different. For example, in the deposition step, RF power sufficient to induce a surface reaction between the reaction gas and the source gas on the substrate is supplied, but in the post-treatment step, a larger amount of RF power is supplied to change the properties of a deposited film. For example, in order to decrease a film etch rate and densify a film, RF power having a larger magnitude than that of the deposition step may be supplied. In another embodiment, in order to remove a film deposited on the side of a gap structure while leaving a film formed on the top and bottom surfaces of the gap structure, a larger magnitude of RF power may be supplied in the deposition step. In another embodiment, RF power of the same magnitude may be supplied. Alternatively, a lower level of RF power may be supplied in the post treatment step. In this case, as described above, due to a change in process conditions between steps (change in RF power magnitudes between t1 and t3 steps), impedance mismatch between the RF power generator and the reactor occurs and reflected power is generated, resulting in RF power loss. Accordingly, impedance matching between the RF power generator and the reactor is performed by the matching network. In the case of the embodiment of FIG. 22, impedance matching between a plurality of RF supply steps is performed according to the process described in FIG. 21 during the first purge step t2 or the second purge step t4. That is, impedance matching is performed together during the removal of a residual gas.

Figure 23:
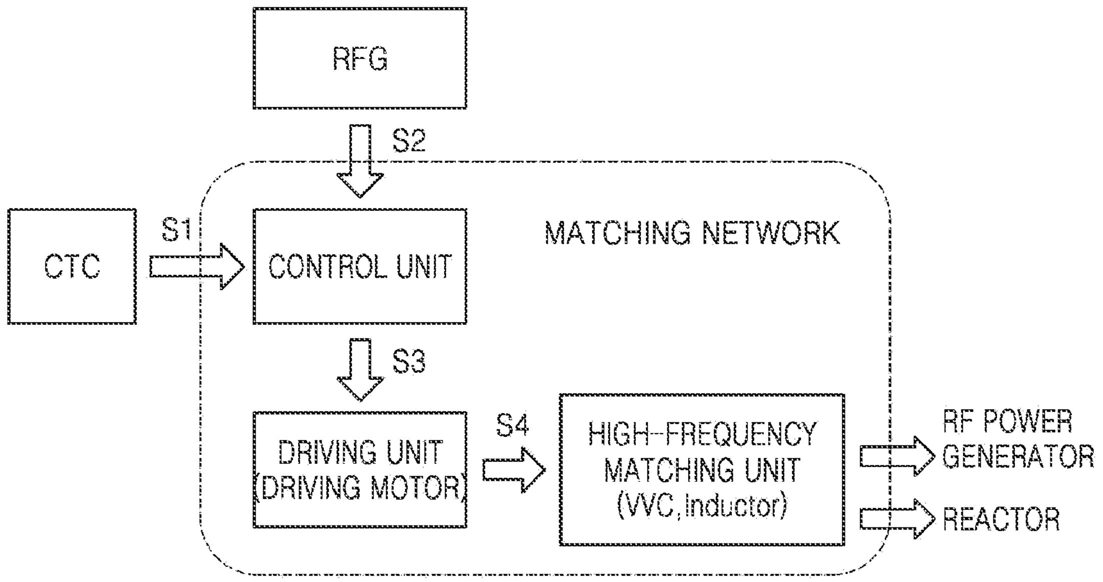
FIG. 23 is a conceptual diagram of a matching network and a peripheral controller according to an embodiment.

FIG. 23 is a conceptual diagram of a matching network and a peripheral controller according to an embodiment. In the matching network of FIG. 23, the high-frequency matching unit includes matching devices, wherein the matching devices include two VVCs and one inductor. A driving unit includes two driving motors each connected to a variable capacitor to move the variable capacitor. In an embodiment, the matching network of FIG. 23 may correspond to the matching device of FIG. 21B.

In FIG. 23, RF table information is input to a PC controller CTC. VVC tuning information and an inter step time are input to the RF table. The VVC tuning information, a VVC movement position at which reflected power becomes the minimum or '0' compared to applied RF power (forward power), is input in percent (%) units, and is defined as a preset point of a VVC before an RF application step. Accordingly, by moving the VVC to the preset point before RF power is applied according to the VCC tuning information, reflected power may be minimized when the RF power is applied, and there is a technical effect that enables fast matching without a separate matching process.

The inter step time is a separation time between RF power application steps during plasma processing, and is defined as a minimum physical separation time for tuning a VVC and moving the VCC to a preset position between the RF power application steps. The inter step time (t2 and t4 in FIG. 22) may correspond to the time between the RF power application steps, such as a purge step. When there is no inter step time, an RF application step of the next step proceeds before VVC tuning is completed, and reflected power is generated due to impedance mismatching between RF application steps, which may cause defects in a substrate process. Therefore, when an RF-off time t2 (in FIG. 22) period between a first RF power supply step t1 (in FIG. 22) and the second RF power supply step t3 (in FIG. 22) is longer than the inter step time, the second RF power supply step t3 (in FIG. 22) proceeds, and when the RF-off time t2 is shorter than the inter step time, matching is attempted again at the preset position of the previous step. There is a technical effect of avoiding unstable matching with such an algorithm. That is, the inter step time has a technical effect that may prevent mismatch during a fast process cycle.

The RF table is input to a CTC as matrix information prepared by securing a tuning condition of a VVC in which reflected power becomes the minimum or '0' compared to applied RF power under a specific process condition through individual experiments. For example, when 1,000 W of RF power is applied to a reactor under certain pressure, flow, and temperature conditions, if reflected power becomes '0' when two VVCs (e.g., 13 and 14 in FIG. 2B) are tuned to 30% and 40% respectively in a matching network, 30% and 40% preset positions are input for respective VVCs. Therefore, during the RF-off time period, an inter-step time capable of VVC tuning is secured and input to the CTC. FIG. 24 shows an example of an RF table.

FIG. 24 shows a preset position of each of two VVCs (VVC1 and VVC2) and an inter step time that enables fast impedance matching without generation of reflected power for each reactor in a chamber having four reactors. In an embodiment, FIG. 24 is applicable to the substrate processing process of FIG. 22 (actual evaluation temperature, pressure, flow, and RF power conditions are not shown). The following description is based on the assumption that the condition of FIG. 24 is applied to FIG. 22.

In FIG. 24, START POSITION is a first preset position of each of the two VVCs before a first RF power supply step in a first cycle, and is set before step t1 of the first cycle of FIG. 22. In the deposition step t1 of FIG. 22, first RF power is supplied under preset position conditions of the two VVCs set in this step, and a plasma process (deposition) is performed.

STEP1 is a step for setting a preset position of each of the two VVCs after the first RF power is supplied, that is, after the plasma deposition process is performed and before a second RF power supply step. This step may be performed in step t2 (first purge step) of FIG. 22, and tuning for setting a second preset position of a VVC is performed. In this step, the inter step time is set to 120 ms. In step t3, when a purge time of the first purge step t2 is longer than an inter-step time of STEP 1 according to process conditions input to a CTC, a VVC is tuned to the preset positions of the two VVCs set, and then second RF power is supplied and a plasma process (post treatment) is performed.

STEP2 is a step for setting a third preset position of each of the two VVCs after the second RF power is supplied, that is, after the plasma post-treatment process is performed and before the first RF power is supplied to perform the deposition process again. This step may be performed in step t4 (second purge step) of FIG. 22, and tuning for setting a third preset position of a VVC is performed. In STEP 2, the inter step time is set to 120 ms. When a purge time of the second purge step t4 is longer than the inter step time of STEP 2 according to process conditions input to a CTC, a VVC is tuned to the third preset positions of the two VVCs set. Thereafter, in step t1, the first RF power is supplied and a plasma process (deposition) is performed. STEP1 and STEP2 are repeated a plurality of times until a desired film thickness is achieved according to process conditions. In an embodiment, the first preset point and the third preset position may be the same.

Although FIG. 24 has been applied to the substrate processing process of FIG. 22, which consists of applying two RF powers of different magnitudes, the same may be applied to a substrate processing process that includes applying three or more RF powers. In such a case, a VVC preset position setting step may be added and proceeded in FIG. 24 (e.g., an nth preset position).

According to the disclosure, before a substrate processing process, for example, the substrate processing process according to FIG. 22 is started, RF table information input to a CTC is transmitted to a control unit S1 (of FIG. 23) of the matching network. In step S3 of FIG. 23, the control unit of the matching network drives a motor of a driving unit according to VVC tuning information in an RF table, and in step S4 of FIG. 23, a high-frequency matching unit pre-moves two VVCs to a preset position according to the VCC tuning information. For example, in step S2, when first RF power application step t1 (of FIG. 22) is finished when the substrate processing is performed according to FIG. 22, the control unit of the matching network receives an RF-off signal from an RF power generator. In addition, when the RF-off time period (t2) according to process conditions stored in a CTC is longer than a set value (inter step time) stored in the control unit of the matching network, a VVC performs pre-movement to the preset position during the RF-off time period (t2), and then a second RF power application step t3 (of FIG. 22) is performed.

Figure 25:
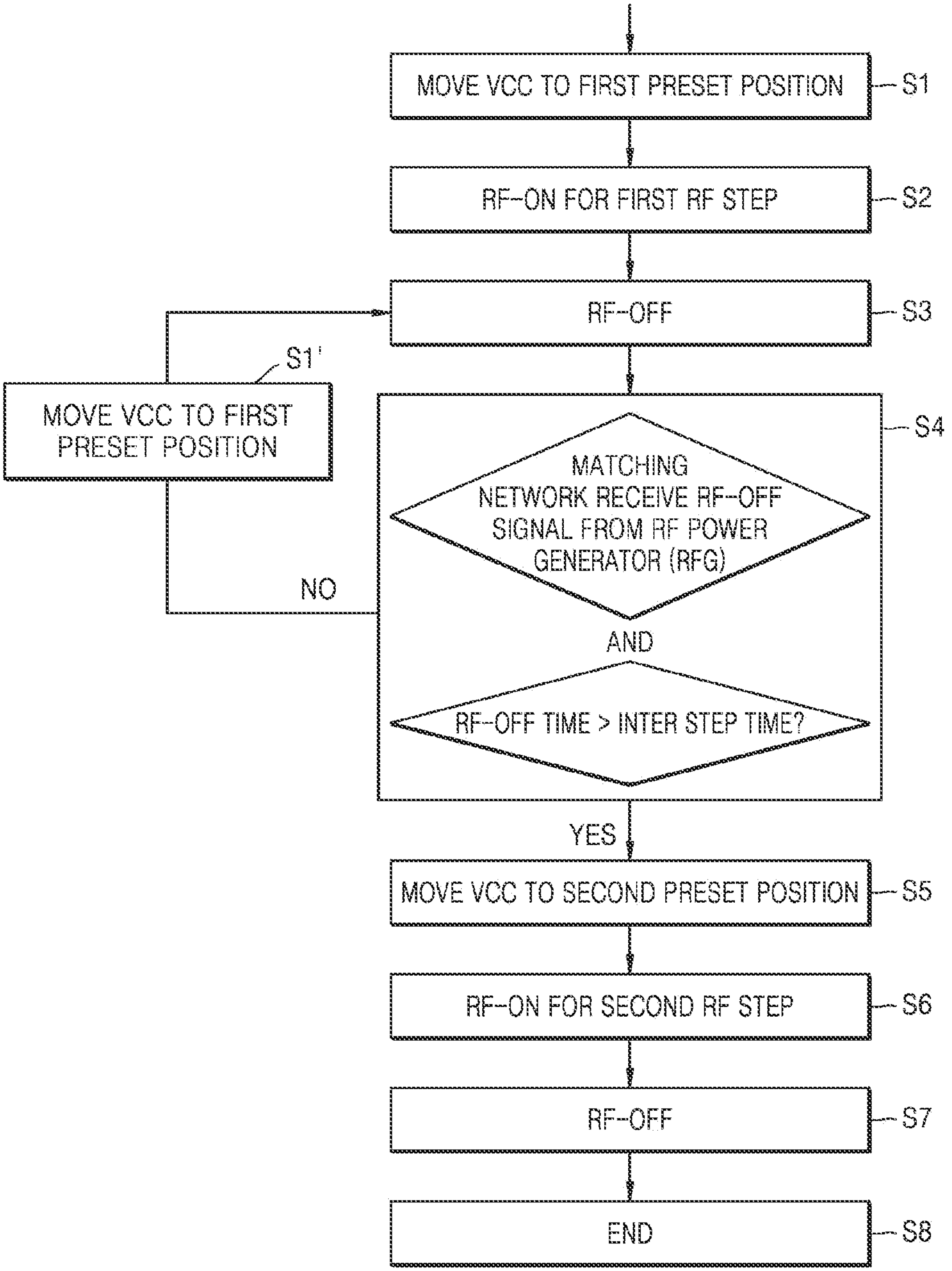
FIG. 25 is a process flowchart according to an embodiment.

FIG. 25 is a process flowchart according to an embodiment, and shows an impedance matching method that enables fast impedance matching without reflected power in a plasma deposition process method including a unit cycle in which RF powers of different magnitudes are sequentially and intermittently supplied.

A detailed description of each step of FIG. 25 is as follows.

1) First step S1: In a reactor on which a substrate is mounted, a VVC is moved to a first preset position corresponding to first RF power according to information on an RF table input to a matching network. This step may be performed in a preheating step of preheating a substrate prior to a substrate processing process. Alternatively, a purge step may be added and performed before a first RF power supply step. In addition, according to FIG. 23, there may be two VVCs and the VVCs may be tuned to each preset position.
2) Second step S2): This step may be, for example, the deposition step t1 of FIG. 22 as the first step of processing the substrate. In this step, the first RF power may be applied from an RF power generator to the reactor. Because a VVC matching device is pre-tuned to the first preset position in the first step, reflected power is not generated.
3) Third step S3): In this step, as an RF-off step, no RF power is applied from the RF power generator to the reactor. This step may be, for example, the first purge step t2 of FIG. 22.
4) Fourth step S4): This step is a step of determining whether a VVC may be tuned to a second preset position corresponding to second RF power according to the information on the RF table input to the matching network. This step may be performed, for example, in the purge step t2 of FIG. 22. In this step, the matching unit receives a signal from an RF power generator (RFG) indicating that the RFG is in an off state. In addition, RF-off time information is received from a process recipe in which process conditions are input. The RF-off time information may be, for example, the time t2 (of FIG. 22) of the purge step. As described above, in step S5, when conditions that the RFG is off and an RF-off time is greater than an inter step time for the second preset position input to a control unit are simultaneously satisfied, a VVC is tuned to the second preset position. In step S1', when both conditions are not satisfied at the same time, the VVC moves to the first preset position and tries to match again until the above two conditions are satisfied.

In a chamber provided with a plurality of reactors (a multi-reactor chamber), the reactors are influenced by each other by RF power applied to each reactor (Cross-Talk effect). Accordingly, by directly receiving an RF-off signal from an RF power generator of a corresponding reactor where the process is in progress, there is a technical effect of blocking the effect of RF power from other reactors and preventing a matching malfunction.

In addition, in a plasma process with a short process cycle, the next RF power application step is performed in a state in which tuning of a matching device is not completed, so that a matching malfunction occurs and reflected power is generated. Therefore, by setting an inter step time to secure a physical period for tuning a matching device, there is a technical effect that may prevent a matching malfunction from occurring even during a short process. Accordingly, when the above two conditions are satisfied, the matching device may be tuned.

5) Fifth step S5): In this step, the two conditions (when the RFG is off and the RF-off time is greater than the inter step time input to the control unit) are satisfied in the fourth step, so that a VVC of the matching network is tuned to the second preset position corresponding to the second RF power. This step may be performed, for example, in the purge step t2 of FIG. 22.

6) Sixth step S6): This step may be, for example, post treatment step t3 of FIG. 22 as the second step of processing the substrate. In this step, the second RF power may be applied from the RF power generator to the reactor. Because a VVC matching device is pre-tuned to the second preset position in the fifth step, reflected power is not generated. The magnitude of the second RF power in this step is different from the magnitude of the first RF power. For example, the magnitude of the second RF power may be greater than the magnitude of the first RF power. In another embodiment, the magnitude of the second RF power may be smaller than the magnitude of the first RF power.

7) Seventh step S7): In this step, as an RF-off step, no RF power is applied from the RF power generator to the reactor. This step may be, for example, the second purge step t4 of FIG. 22. In this step, in the seventh step S7), that is, in the second purge step t4) of FIG. 22, it is determined whether a VVC may be tuned to the first preset position to correspond to the first RF applied power as in the fourth step S4). That is, when conditions that the RFG is off and the RF-off time is greater than an inter step time for the first preset position input to the control unit are simultaneously satisfied, the VVC is tuned to the first preset position. When both conditions are not satisfied at the same time, the VVC moves to the second preset position and tries to match again until the above two conditions are satisfied.

8) Eighth step S8): When a desired film thickness is deposited while performing the first step S1) to the seventh step S7) a plurality of times, the process is terminated.

Figure 26:
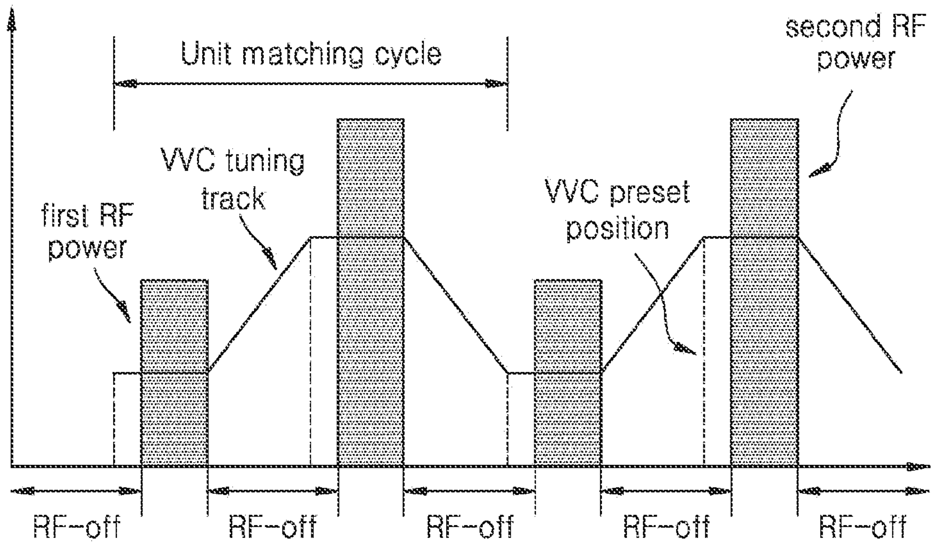
FIG. 26 is a conceptual diagram illustrating a matching cycle, and also shows a tuning track of a VVC versus applied RF power.

FIG. 26 is a conceptual diagram illustrating a matching cycle, and also shows a tuning track of a VVC versus applied RF power.

FIG. 26 shows a process in which a preset position of a matching device of a VVC in a matching network is set for impedance matching in a plasma process to which RF powers (first RF power and second RF power) of different magnitudes are periodically applied like the substrate processing process of FIG. 22. Steps of applying the first RF power and the second RF power correspond to t1 and t3 of FIG. 22, respectively, and an RF-off step between the first RF power application step and the second RF power application step corresponds to the first purge step t2 of FIG. 22, and an RF-off step between the second RF power application step and the first RF power application step corresponds to the second purge step t4 of FIG. 22. As shown in FIG. 26, when RF power is applied, an RF-off signal is transmitted from an RF power generator to a controller of a matching network. At the same time, when an RF-off period is greater than the inter step time, a step of setting a preset position of a VVC matching device is performed during the RF-off period. Thereafter, the VVC matching device is pre-located at the preset position before RF application, which is the next step, so that when the next RF power is applied, a plasma process may be performed immediately without performing a separate matching process. Therefore, there is a technical effect of enabling fast matching and increasing substrate processing speed.

Figure 27:
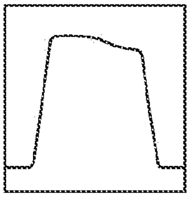
FIG. 27 is a view illustrating reflected power generated when an existing impedance matching method and a preset impedance matching method according to an embodiment are applied.
Figure 27:
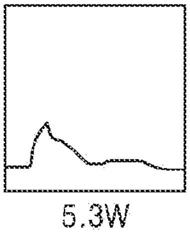
Figure 27:
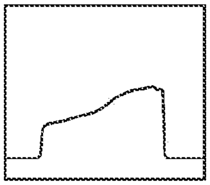
Figure 27:
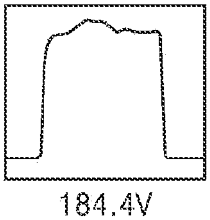

FIG. 27 shows reflected powers generated when an existing automatic impedance matching method (auto-matching) and a preset position matching method (preset position matching) according to an embodiment are applied in the plasma process of FIG. 22 respectively.

In FIG. 27, when applying the existing automatic impedance matching method (auto-matching), the reflected power is measured to be 82.5 W, and when applying the preset position matching method according to the disclosure, the reflected power is measured to be 5.3 W. Therefore, it can be seen that the preset position matching method is more effective. In addition, the magnitude of RF power participating in an actual substrate process in a reactor is measured using peak-to-peak voltage (Vpp). Vpp represents a voltage magnitude between positive and negative peaks of an RF alternating current wavelength, and the larger Vpp indicates that the RF power participating in the actual substrate process is greater. Therefore, reflected power and Vpp show an inverse relationship. As shown in FIG. 27, in the case of the existing automatic matching method, Vpp is 65.8 V, whereas in the case of the preset matching method according to the disclosure, Vpp is 184.4 V. Accordingly, it can be seen that when the preset matching method is performed, more RF power may participate in the substrate process than in the case of the automatic matching method.

According to an embodiment, in a plasma process to which RF powers of different magnitudes are periodically applied, faster impedance matching is performed without generation of reflected power. In more detail, when two conditions that a matching network receives an RF-off signal from an RF power generator after RF power is applied to a reactor, and a purge step time is longer than a inter step time in a process recipe are satisfied, tuning and a preset position of a matching device are set before the next RF power is applied. Accordingly, a matching malfunction due to the influence of RF power applied to/from other reactors and a short process time may be prevented, and a stable plasma process is possible.

It is to be understood that the shape of each portion of the accompanying drawings is illustrative for a clear understanding of the disclosure. It may be noted that the portions may be modified into various shapes other than the shapes shown.

The disclosure described above is not limited to the above-described embodiment and the accompanying drawings, and it will be apparent to those of ordinary skill in the art to which the disclosure pertains that various substitutions, modifications, and changes are possible within the scope of the disclosure without departing from the technical spirit of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method using a substrate processing apparatus including a scheduler, a power generation unit, a first reactor, and a matching network located between the power generation unit and the first reactor and comprising a control unit, the substrate processing method comprising:

supplying a source gas under a first plasma atmosphere;

purging the source gas;

supplying a reaction gas under a second plasma atmosphere; and purging the reaction gas, wherein setting a variable capacitor included in the matching network to a first value is performed during the purging of the source gas, and setting the variable capacitor to a second value is performed during the purging of the reaction gas, wherein the control unit is configured to perform a first adjustment operation on the variable capacitor included in the matching network during at least one of the purging of the source gas and the purging of the reaction gas, wherein the control unit is configured to determine, during the first adjustment operation, whether a first condition in which the matching network receives a turn-off signal from the scheduler and a second condition in which turn-off duration of the power generation unit is greater than a time required for capacitance switching of the variable capacitor are satisfied, and wherein the control unit performs a second adjustment operation on the variable capacitor after the first adjustment operation when both the first condition and the second condition are satisfied.

2. The substrate processing method of claim 1, wherein the variable capacitor comprises a moving unit and is configured to have a capacitance that is changed by movement of the moving unit, wherein a driving unit sets the variable capacitor to the first value by moving the moving unit to a first position in response to a first control signal from the control unit, and sets the variable capacitor to the second value by moving the moving unit to a second position in response to a second control signal from the control unit.

3. The substrate processing method of claim 2, wherein the control unit is configured to receive first information from the scheduler and receive second information from the power generation unit.

4. The substrate processing method of claim 3, wherein the power generation unit and the control unit are configured to receive a turn-off signal from the scheduler, wherein the turn-off signal is different from the first information and the second information.

5. The substrate processing method of claim 3, wherein the first information comprises a value related to a moving time of the moving unit of the variable capacitor, and the second information comprises a value related to a power level of the power generation unit.

6. The substrate processing method of claim 5, wherein the first information is a preset value stored in the scheduler.

7. The substrate processing method of claim 5, wherein the control unit is configured to calculate turn-off duration of the power generation unit from a value related to the power level of the power generation unit.

8. The substrate processing method of claim 7, wherein the control unit is configured to calculate the turn-off duration by counting a time point at which the value related to the power level is maintained.

9. The substrate processing method of claim 7, further comprising:

during at least one of the setting of the variable capacitor to the first value and the setting of the variable capacitor to the second value, comparing a moving time of the moving unit with the turn-off duration of the power generation unit.

10. The substrate processing method of claim 9, wherein the control unit is configured to determine whether the turn-off duration is greater than the moving time during the comparing of the moving time of the moving unit with the turn-off duration of the power generation unit.

11. The substrate processing method of claim 1, wherein the control unit is configured to perform the second adjustment operation on the variable capacitor included in the matching network during at least one of the supplying of the source gas and the supplying of the reaction gas, and wherein a capacitance change range of the variable capacitor during the first adjustment operation is greater than a capacitance change range of the variable capacitor during the second adjustment operation.

12. The substrate processing method of claim 1, wherein at least one of the setting of the variable capacitor to the first value and the setting of the variable capacitor to the second value is performed in response to at least one control signal generated by the control unit, wherein the control unit is configured to prevent generation of the at least one control signal due to noise.

13. The substrate processing method of claim 12, wherein the noise comprises crosstalk power transmitted from a second reactor adjacent to the first reactor.

* * * * *